United States Patent [19]

Ohashi et al.

[11] Patent Number: 6,014,028
[45] Date of Patent: *Jan. 11, 2000

[54] SURFACE POTENTIAL SENSING DEVICE

[75] Inventors: Mikio Ohashi; Mitsuru Shingyouchi, both of Yokohama, Japan

[73] Assignee: Ricoh Company, Ltd., Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/742,759

[22] Filed: Nov. 1, 1996

[51] Int. Cl.[7] .................................................. G01R 27/26
[52] U.S. Cl. .......................... 324/661; 324/663; 324/457
[58] Field of Search ..................................... 324/457, 661, 324/663, 72, 458, 109, 118; 399/73; 318/483

[56] References Cited

U.S. PATENT DOCUMENTS

| | | | |
|---|---|---|---|
| 3,852,667 | 12/1974 | Williams | 324/72 |
| 4,367,948 | 1/1983 | Suzuki | 355/14 |
| 4,569,583 | 2/1986 | Robson | 399/73 |
| 4,725,393 | 2/1988 | Kumada | 324/458 |
| 4,748,390 | 5/1988 | Okushima | 318/483 |
| 4,973,910 | 11/1990 | Wilson | 324/457 |
| 5,539,319 | 7/1996 | Yamada | 324/458 |

*Primary Examiner*—Josie Ballato
*Assistant Examiner*—Thomas Valone
*Attorney, Agent, or Firm*—Oblon, Spivak, McClelland, Maier & Neustadt, P.C.

[57] ABSTRACT

In a surface potential sensing device, a sense electrode electrically independent of an object is located at a preselected distance from the object for sensing the surface potential of the object Electrostatic capacitance between the object and the sense electrode is varied in order to detect two or more variables in a potential signal output from the sense electrode. The potential detection signal is corrected on the basis of the two or more variables.

31 Claims, 28 Drawing Sheets

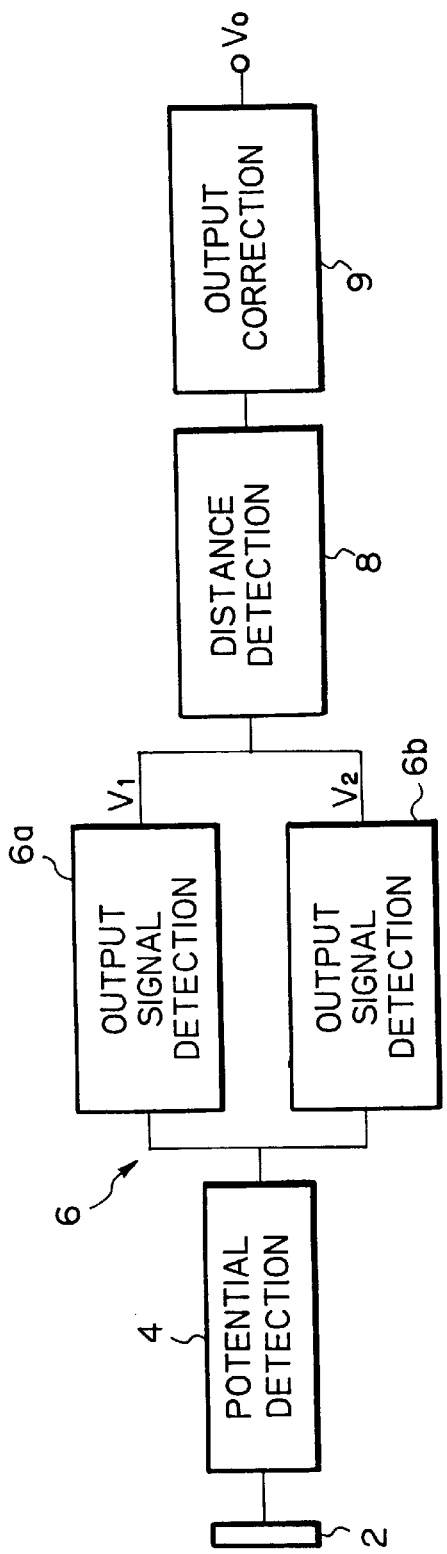
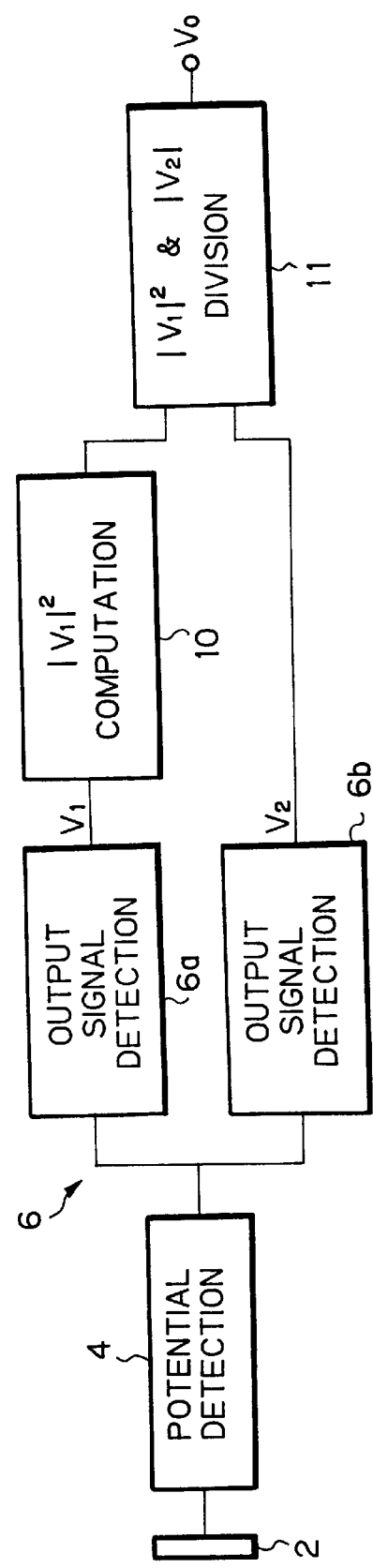

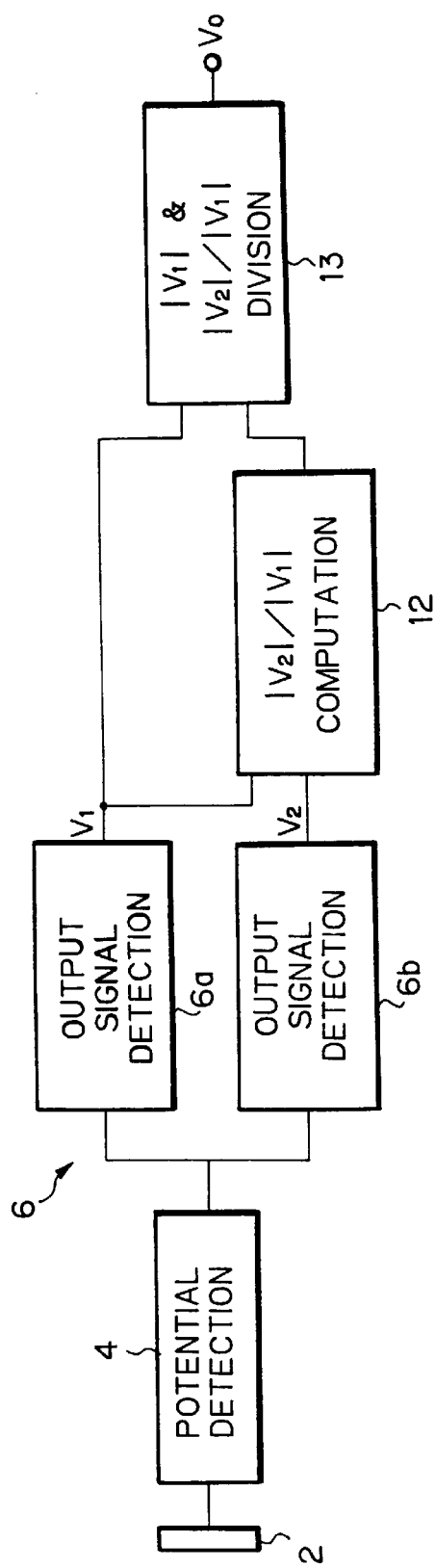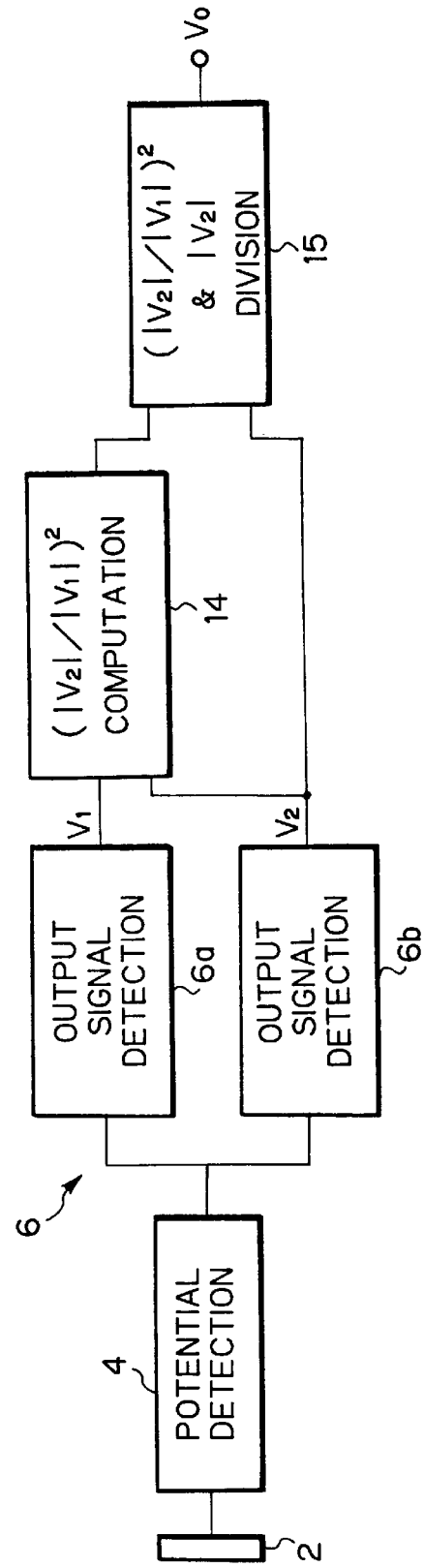

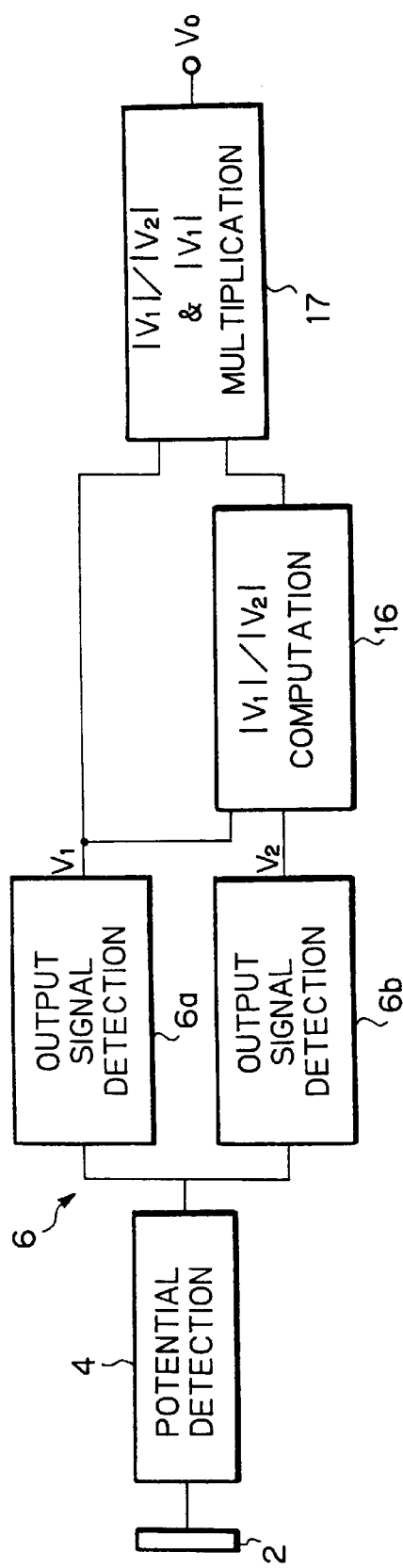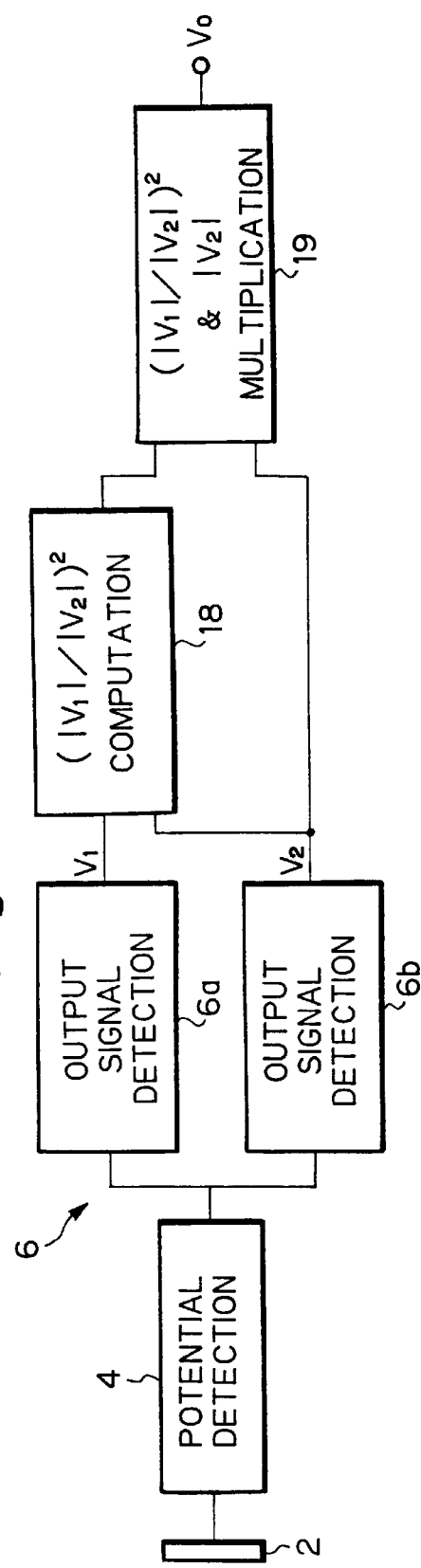

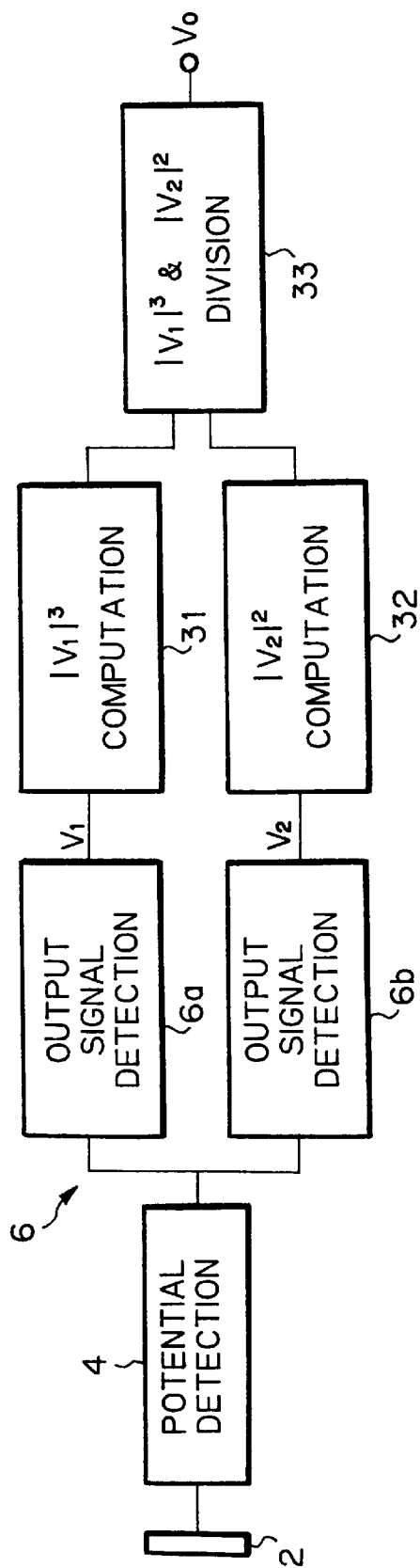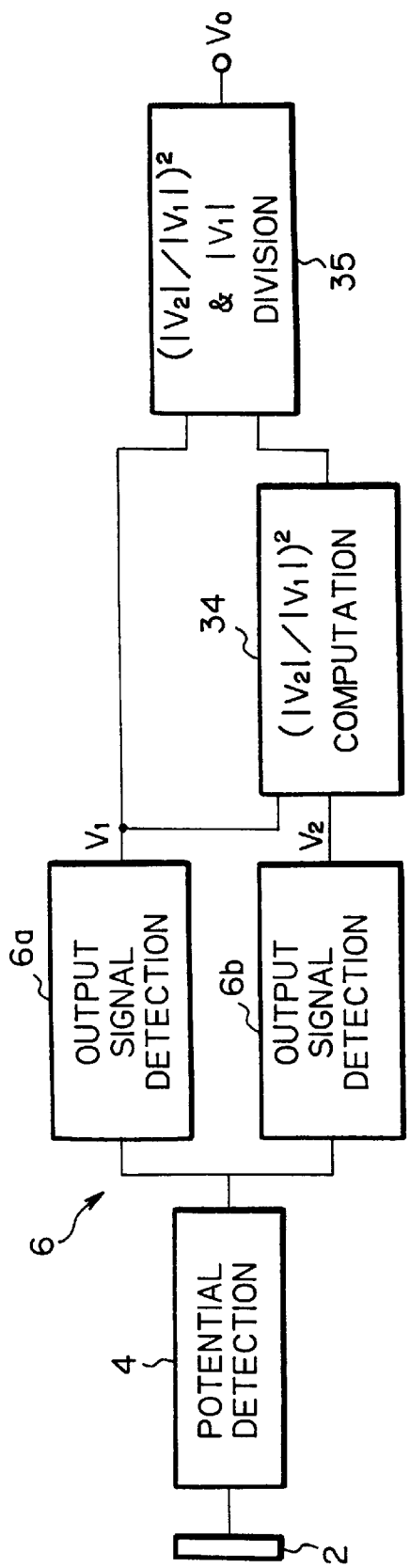

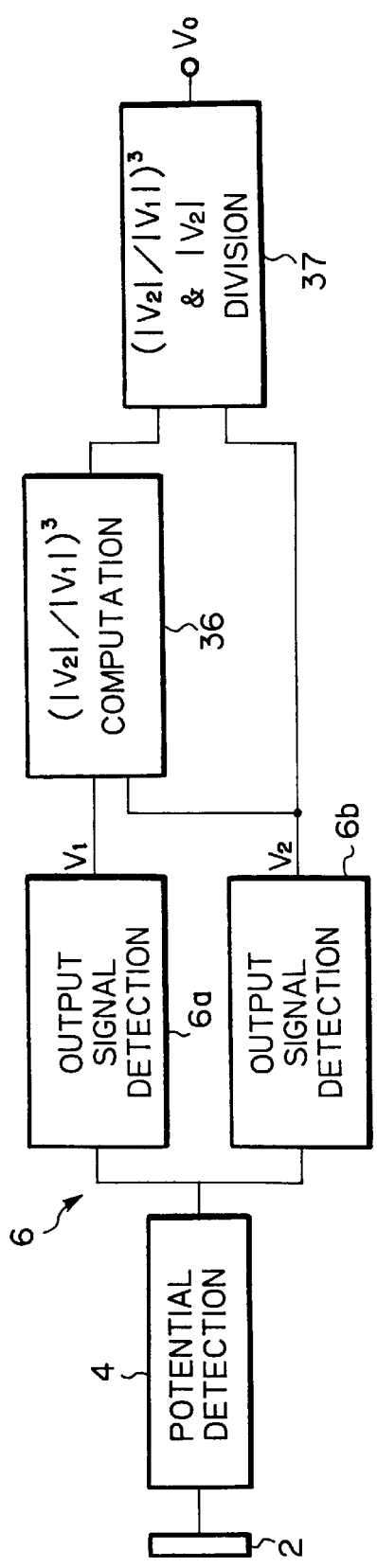
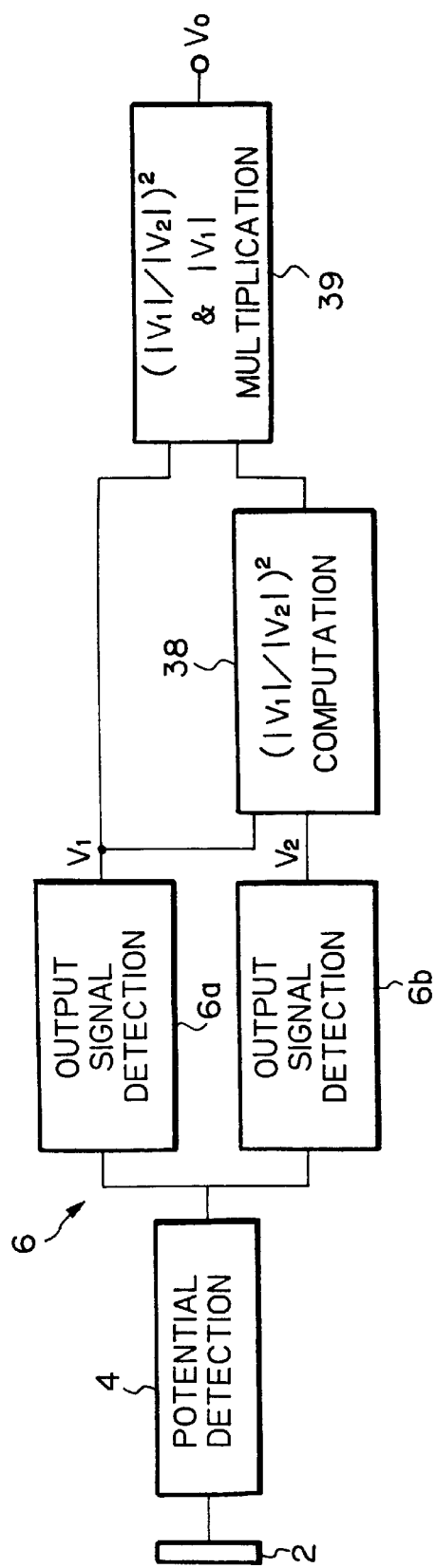

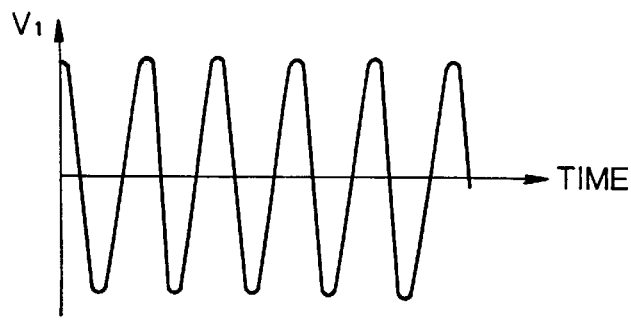
Fig. 25
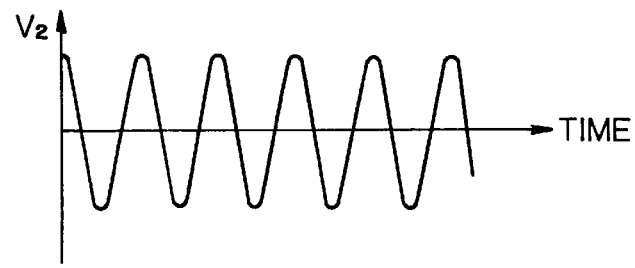
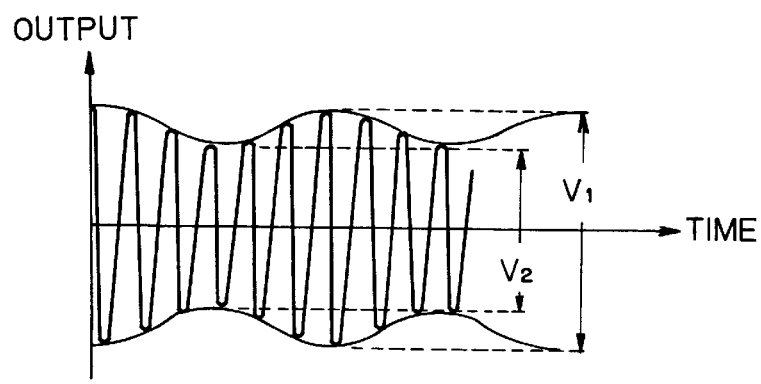
Fig. 26
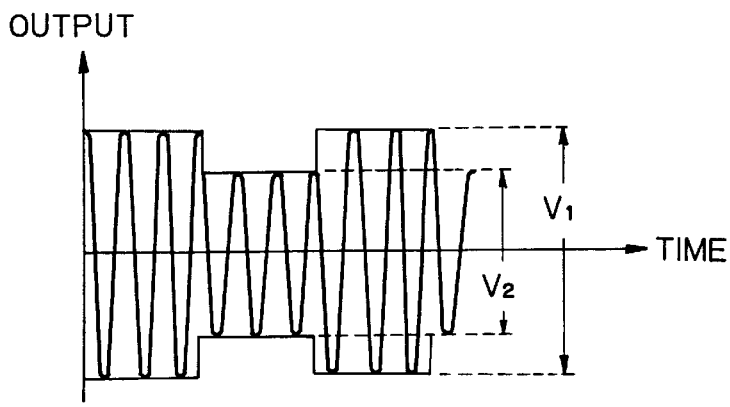
Fig. 27

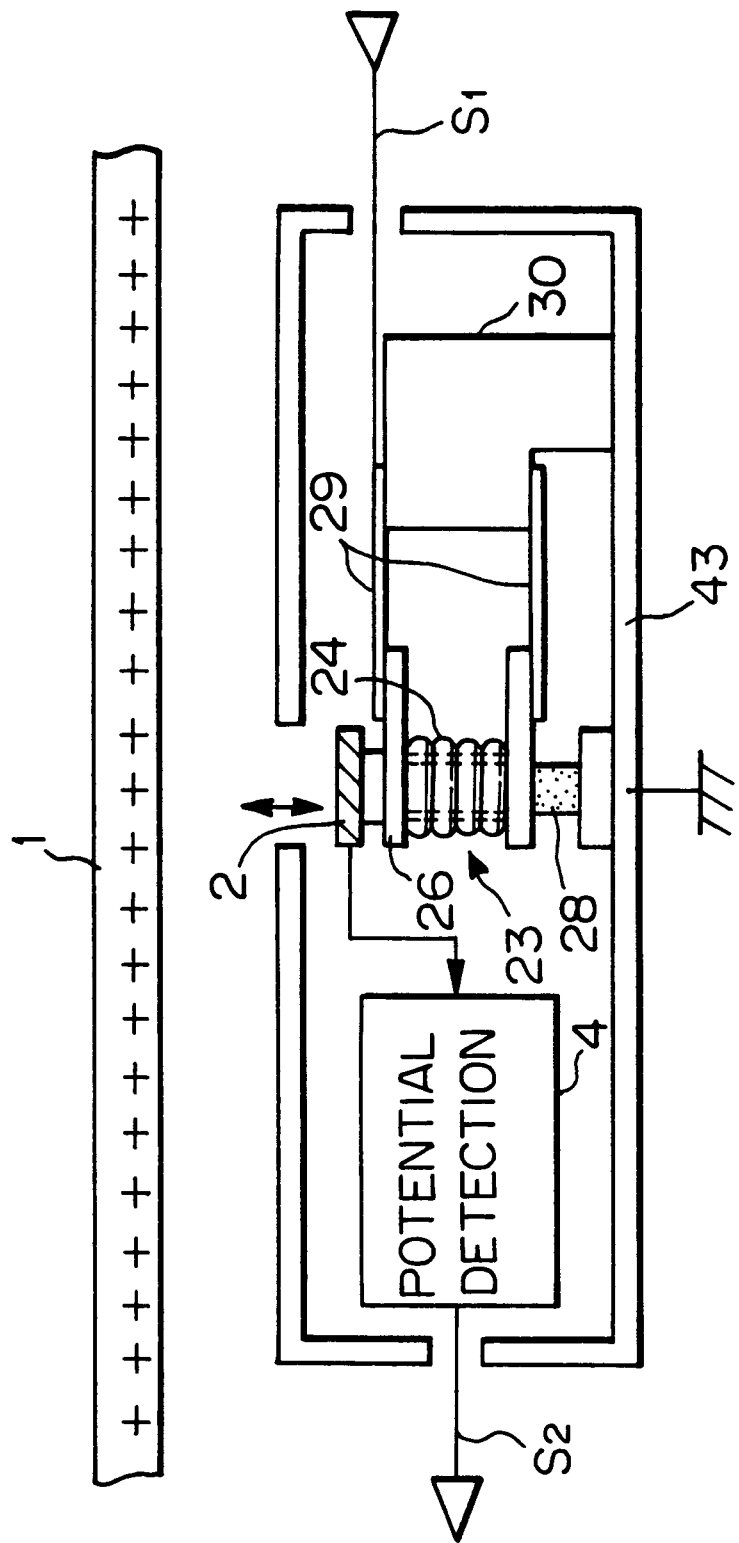

SURFACE POTENTIAL SENSING DEVICE

BACKGROUND OF THE INVENTION

The present invention relates to a device for sensing the surface potential of a conductor, insulator or similar object with a sense electrode not contacting the object. More particularly, the present invention is concerned with a surface potential sensing device suitable for the control of the charge potential of, e.g., a photoconductive element or a developing roller included in a copier, facsimile apparatus, printer, plotter or similar image forming apparatus.

In various technological fields, it is often necessary to sense or measure the surface potential of a conductor, insulator or similar object. In a copier, for example, the surface potential of a photoconductive element must be accurately sensed and controlled in order to enhance image quality. It has been customary with a copier to use a noncontact type surface potential sensor capable of obviating the leak of charge from the object. The noncontact type sensor operates either electrically or mechanically. A problem with the electric sensor is that it is expensive due to the use of a special functional material. Another problem is that the sensitivity of the electric sensor falls due to contamination ascribable to deposits and the polarization of an insulator used. The mechanical sensor is predominant over the electrical sensor because it is free from the fall of sensitivity ascribable to contamination and comparatively inexpensive.

The mechanical sensor is provided with either a chopper type configuration or a vibrating-reed type configuration In the chopper type configuration, an electric line of force input to a sense electrode is interrupted periodically in order to vary the amount of charge to be induced on the electrode, thereby outputting an AC signal. In the vibrating-reed type configuration, a sense electrode is displaced periodically in the direction of an electric field extending from an object. As a result, electrostatic capacitance between the object and the sensor electrode varies periodically, allowing a varying AC signal to be output. Japanese Patent Publication No. 63-1547, for example, teaches a relatively simple and inexpensive surface potential sensor including a tuning fork serving a s chopper means, The tuning fork is caused to vibrate to output an AC signal representative of the surface potential of an object On the other hand, Japanese Patent Laid-Open Publication No. 60-120267 discloses a surface potential sensor in which a tuning fork or vibrator is caused to vibrate in a direction substantially parallel to an electric field formed between a sense electrode and an object. In this condition, an AC signal representative of the surface potential of the object is output with an enhanced SIN (Signal-to-Noise) ratio.

The conventional sensors described above have some problems left unsolved, as follows, When it is desired to sense the surface potential with a higher S/N ratio or sensitivity, the amplitude of vibration of the tuning fork or vibrator must be further increased. To increase the amplitude of vibration, the mechanical resonance vibration of the fork may be used, or the dimension of the fork in its lengthwise direction may be increased. However, the problem with the mechanical resonance vibration scheme is that the resonance point (resonance frequency) and therefore a surface potential signal representative of the amplitude of vibration is extremely unstable. This makes it difficult to detect an accurate surface potential. The problem with the elongate fork scheme is that a sensor probe becomes bulky.

The tuning fork is caused to oscillate by a piezoelectric material or an electromagnetic coil mounted thereon. However, the piezoelectric material is susceptible to mechanical stresses, i.e., it is apt to crack or bread Further, when an overvoltage is applied to the piezoelectric material, the polarization of the material is destroyed and prevents the sense electrode from being displaced. Moreover, the piezoelectric material is relatively expensive. In addition, the width over which the material is displacable is susceptible to the environment (particularly temperature), so that the sensed values is apt to be unstable. On the other hand, the electromagnetic coil has a complicated structure. At the present stage of development, it is extremely difficult to obtain an electromagnetic coil as small as 1 $cm^3$ or less on the market. This obstructs the miniaturization of the sensor probe.

In the conventional sensor arrangements, electrostatic capacity between the object and the sense electrode is proportional to the reciprocal of the distance between them, so that the output value varies noticeably along with the above distance. For example, assume that the sensor senses the surface potential of a photoconductive drum included in a copier and rotatable in a preselected direction. Then, whether a change in the output value is ascribable to the potential distribution of the drum or whether it is ascribable to the distance between the drum and the sense electrode cannot be determined. This makes it difficult to measure the surface potential with accuracy.

In light of the above, a distance correction type surface potential sensor allowing a minimum of change due to a change in distance to occur has been proposed in various forms in the past For example, U.S. Pat. No. 3,852,667 proposes a surface potential sensor including an integration type high-voltage generator. When an output signal is fed to the high-voltage generator, it generates a high voltage matching the input signal and feeds it back to the housing of a sensor probe. As a result, the potential of the object and that of the housing become equal and cancel electrostatic capacity existing therebetween. This prevents the output value from depending on the distance. However, the high-voltage generator brings about the following problems. The high potential which the sensor can sense is limited by the voltage generating ability of the high-voltage generator. The cost of the high-voltage generator increases with an increase in voltage. This increases the cost of high-voltage parts constituting a measuring circuit together with the high-voltage generator, and thereby increases the overall cost of the sensor. Further, a feedback circuit included in the device sophisticates the construction. In addition, the sensor must be handled with greatest care because a high voltage is applied to the sensor probe.

Japanese Patent Publication No. 3-20700 (Japanese Patent No. 1659026) and Japanese Patent Laid-Open Publication Nos. 62-118267 and 62-113072 each discloses a chopper type or a vibrating-reed type surface potential sensor. The chopper type or the vibrating-reed type sensor has two sense electrodes each being spaced a particular distance from an object. Two output signals of the sense electrodes are used to correct the fluctuation of the output ascribable to that of the distance between the object and the electrodes. However, the chopper type sensor seeds a chopper electrode for interrupting the electric line of force input to the sense electrodes, resulting in a complicated structure. Further, two or more sense electrodes are indispensable which further complicate the structure and renders the entire sensor bulky. Also, the increase in the number of parts increases the cost. In addition, because the sense electrodes are held stationary, dust sequentially accumulates on the electrodes due to, e.g., electrostatic adhesion. The dust lowers the sensitivity of the sense electrodes and obstructs accurate measurement. This is particularly critical when the sensor is built in an electrophotographic copier in which various kinds of dust including toner appear.

Japanese Patent Publication No. 4-45109 (Japanese Patent No. 1759275) and Japanese Patent Laid-Open Publication No. 6-308179 each teaches a vibrating-reed type or a chopper type surface potential sensor including a single sense electrode. In this type of sensor, two output signals different in phase or in timing are produced from the sense electrode and used to correct the fluctuation of the output ascribable to that of the distance between the object and the sense electrode. Specifically, in Publication No. 4-45109, the output is corrected on the basis of a difference between two phase outputs. However, when the sense electrode is caused to vibrate by a piezoelectric tuning fork, the level of a signal representative of the above difference is extremely low because the amplitude of vibration is limited Therefore, it is difficult to execute distance correction with a sufficient S/N ratio or to output a sufficiently accurate surface potential. The sensor of Laid-Open Publication No. 6-308179 has the problems described previously in relation to a chopper type sensor, Further, a sample and hold circuit included in this sensor is apt to scatter the measured values and obstruct accurate measurement. In addition, if the surface potential of the object varies while two output signals are produced, then an accurate surface potential is not achievable. A complicated detection circuit is needed in order to produce two output signals at different timings.

SUMMARY OF THE INVENTION

It is therefore an object of the present invention to provide a surface potential sensing device capable of outputting in accurate surface potential.

It is another object of the present invention to provide a surface potential sensing device capable of enhancing an S/N ratio and therefore accurate measurement.

It is a further object of the present invention to provide a simple, miniature and inexpensive surface potential sensing device.

In accordance with the present invention, a device for sensing the surface potential of an object with a sense electrode spaced a preselected distance from the object and electrically independent of the object includes a capacitance varying arrangement for varying electrostatic capacitance between the object and the sense electrode. A potential detecting circuit detects the potential of the sense electrode induced in association with the surface potential of the object and varying along with the electrostatic capacitance. An output detecting circuit detects at least two output signals out of the out of the potential detecting circuit. A surface potential outputting circuit outputs the surface potential of the object in response to the output of the output detecting means

BRIEF DESCRIPTION OF THE DRAWINGS

The above and other objects, features and advantages of the present invention will become apparent from the following detailed description taken with the accompanying drawings in which:

FIGS. 5–10 are block diagrams each schematically showing a specific configuration of the first embodiment;

FIGS. 16–20 each shows a specific configuration of the second embodiment;

FIG. 25 show specific output signals each having a particular value and appearing when the distance between the object and the sense electrode varies;

FIGS. 26–30 each shows a specific signal to appear when the distance between the object and the sense electrode varies in a particular manner;

FIG. 37 shows a seventh embodiment of the present invention, particularly a specific configuration of a probe section;

FIGS. 38A and 39B, 39A and 39D and 40A and 40B each shows another specific configuration of the probe section included in the seventh embodiment.

DESCRIPTION OF THE PREFERRED EMBODIMENTS

Figure 1A:
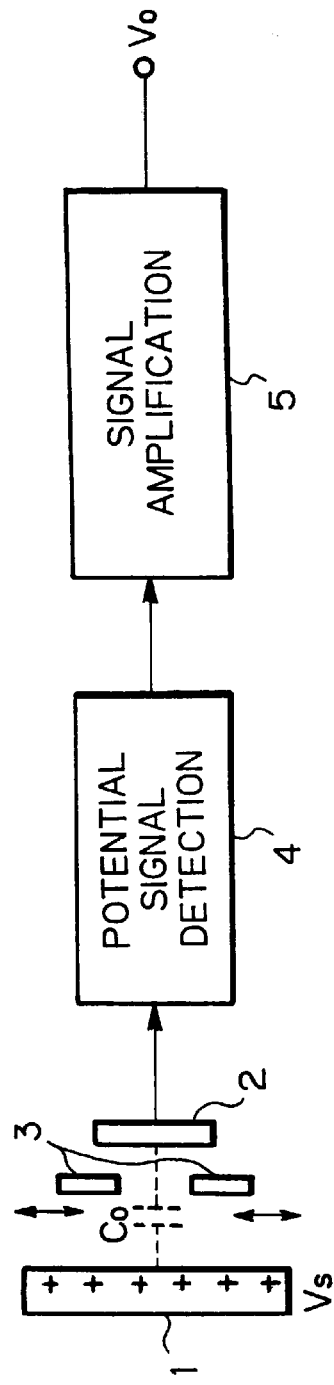
FIG. 1A is a block diagram schematically showing a conventional chopper type surface potential sensing device.
Figure 1B:
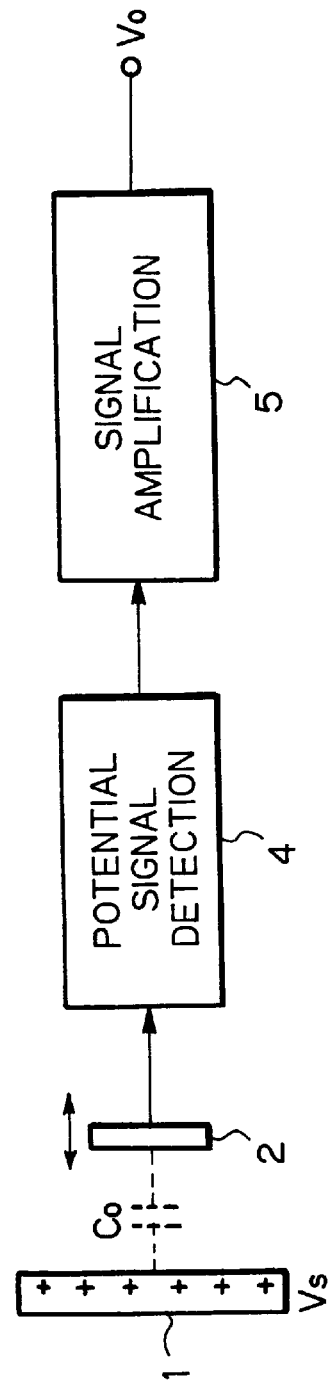
FIG. 1B is a block diagram schematically showing a conventional vibrating-reed type surface potential sensing device.

To better understand the present invention, how conventional mechanical noncontact type surface potential sensing devices operates will be described with reference to FIGS. 1A and 1B. FIG. 1A shows a chopper type mechanical surface potential sensor. As shown, the sensor has a sense electrode 2 facing a desired object 1. A chopper electrode 3 is located between the object 1 and the sense electrode 2 and connected to ground. The chopper electrode 3 is caused to vibrate in a direction indicated by an arrow in FIG. 1A, periodically interrupting an electric line of force input from the object 1 to the sense electrode 2. As a result, electrostatic capacitance $C_0$ between the object 1 and the sense electrode 2 is varied, FIG. 1B shows a vibrating-reed type surface potential sensor which also includes the sense electrode 2 facing the object 1. In FIG. 1B, the sense electrode 2 is caused to vibrate periodically toward and away from the object 1, so that the capacitance $C_0$ between the object 1 and the sense electrode 2 varies. In any case, the capacitance $C_0$ between the object 1 and the sense electrode 2 is varied by mechanical means periodically. The resulting subtle change in the amount of charge induced on the sense electrode is detected by a potential signal detection 4 as an AC signal. The output of the detection 4 is amplified by a signal amplifier 5. Consequently, an output signal $V_0$ corresponding to the surface potential $V_S$ of the object 1 is produced.

Assume that the sense electrode 2 has an effective area S, that the distance between the object 1 and the sense electrode 2 is L, and that the dielectric constant of air is $E_{air}$. Then, the electrostatic capacitance $C_0$ is expressed as:

$$C_0 = \epsilon_{air} \cdot (S/L) \qquad \text{Eq. (1)}$$

The above mechanical sensors each varies the capacitance $C_0$ by varying the area S or the distance L. Assume that a change $C_C$ in the capacitance $C_0$ caused by the periodic mechanical vibration is approximated as:

$$C_C = \alpha_0 \cdot C_0 \cdot \sin\omega t \qquad \text{Eq. (2)}$$

where t is the period of time of change, $\omega$ is the angular frequency of vibration, $\alpha_0$ is the ratio of change of the capacitance $C_0$. Then, a charge $Q_C$ induced on the sense electrode 2 by the surface potential $V_S$ of the object 1 is given by:

$$Q_C = C_C \cdot V_S \qquad \text{Eq. (3)}$$

From the Eqs. (2) and (3), a current $I_C$ to appear in the sense electrode 2 is produced by:

$$I_C = dQ_C/dt = \alpha_0 \cdot \omega \cdot C_0 \cdot V_S \cdot \cos\omega t \qquad \text{Eq. (4)}$$

It follows that the output signal $S_0$ output from the sense electrode 2 is approximated as:

$$V_0 A_0 \cdot \alpha_0 \cdot \omega \cdot C_0 \cdot V_S \cdot \cos\omega t \qquad \text{Eq. (5)}$$

where $A_0$ is a constant relating to the amplification.

As the Eq. (5) indicates, the output signal $V_0$ is proportional to the surface potential $V_S$, capacitance $C_0$, and the ratio of change $\alpha_0$. However, the conventional mechanical noncontact type measurement described above have the following problems left unsolved First, the capacitance $C_0$ is proportional to the reciprocal of the distance L between the object 1 and the sense electrode 2, as the Eq. (1) indicates. Therefore, the output signal $V_0$ proportional to the capacitance $C_0$ also noticeably varies along with the distance L. It follows that when the distance L varies, it is difficult to output in accurate surface potential.

Second, to sense the surface potential with an enhanced S/N ratio, it is necessary to increase the size of the output signal $V_0$, i.e., the sizes of $V_S$, $C_0$ and $\alpha_0$. However, increasing $V_S$ is not desirable because it reduces the dynamic range (range of measurement) of the surface potential due to the enhanced S/N ratio. Also, $C_0$ cannot be increased above a certain limit ascribable to the geometric limit. It is therefore desirable to increase $\alpha_0$. It is a common practice the vary the capacitance $C_0$ by use of a piezoelectric material or an electromagnetic coil mounted on a tuning fork. This brings about a problem that to sense the surface potential with increased $\alpha_0$, the amplitude of vibration of the fork must be increased.

Preferred embodiments of the surface potential sensing device in accordance with the present invention and capable of solving the above problems will be described hereinafter.

Figure 2:
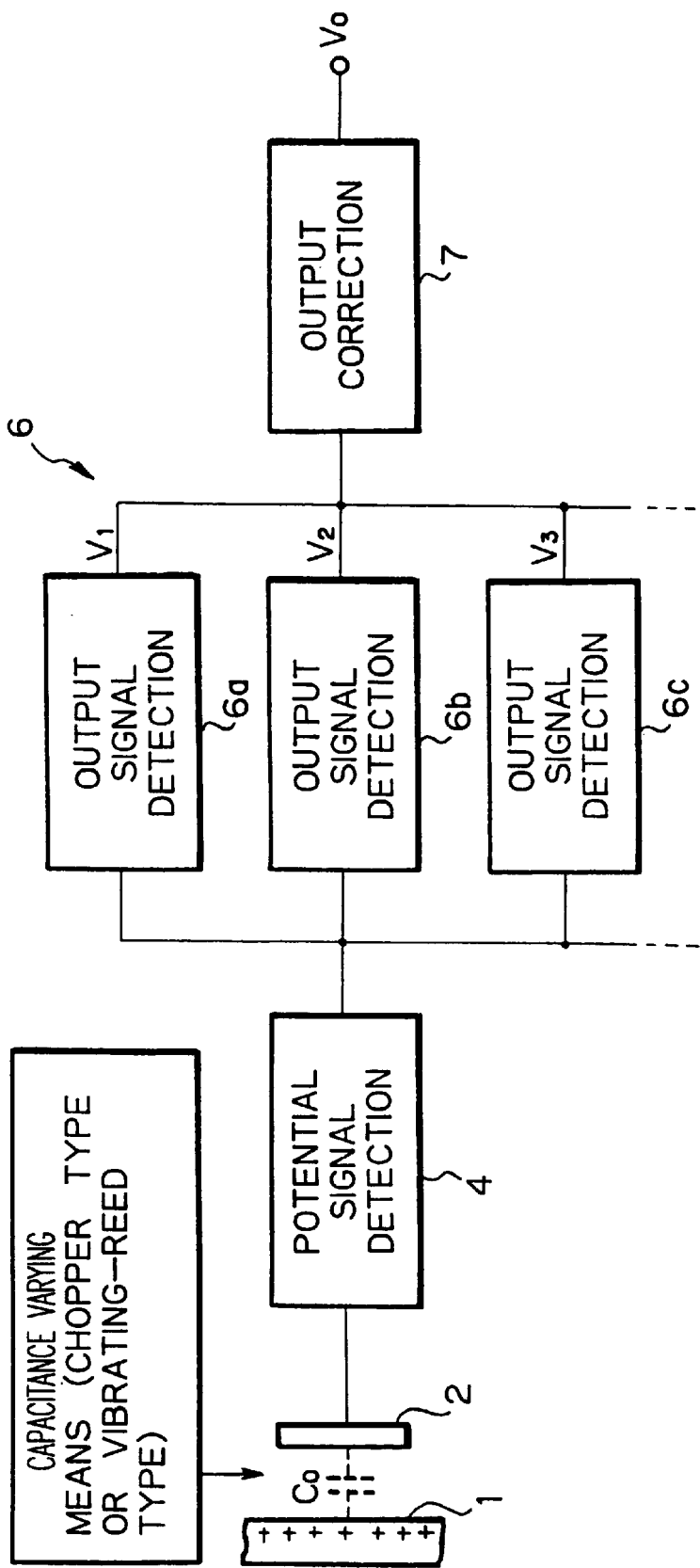
FIG. 2 is a block diagram schematically showing a basic construction of a surface potential sensing device of the present invention.

FIG. 2 shows a basic construction common to the embodiments. As shown, a potential signal detection 4 varies electrostatic capacitance $C_0$ between an object 1 and a sense electrode 2 and detects the resulting potential of the electrode 2. The output signal of the detection 4 is applied to output detecting means 6. The output detecting means 6 detects two or more signals out of the potential signal output from the detection 4. For example, the output detecting means 6 has a plurality of detecting sections 6a, 6b, 6c and so forth each for outputting one of a plurality of output signals $V_1$, $V_2$, $V_3$ and so forth. The signals $V_1$, $V_2$, $V_3$ and so forth vary in accordance with a distance L between the object 1 and the sense electrode. An output correction or surface potential outputting means 7 corrects the fluctuation of the output signals ascribable to that of the distance L. As a result, an accurate surface potential can be measured with high accuracy.

The embodiments sharing the above basic arrangement will be described hereinafter.

1st Embodiment

Figure 3:
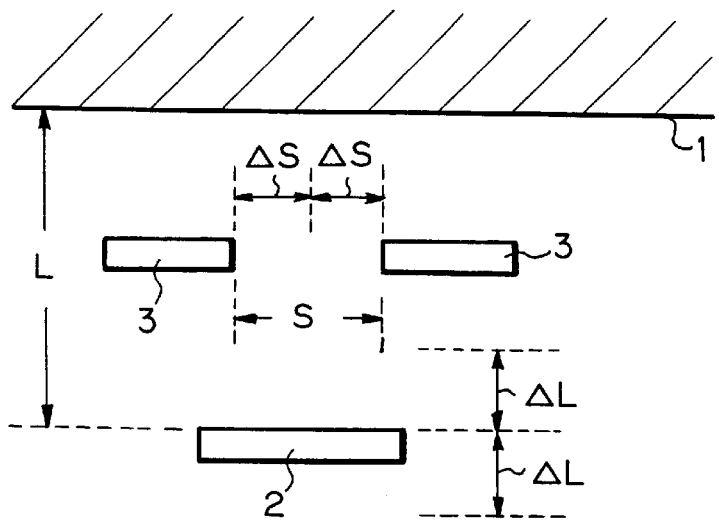
FIG. 3 shows a first embodiment of the present invention.

A plurality of output signals each having a particular frequency are detected out of a single sense electrode 2, and a chopper electrode is used to correct the fluctuation of potential signals. Specifically, as shown in FIG. 3, a chopper electrode 3 and the sense electrode 2 are caused to vibrate periodically and sinusoidally at the same time. The electrodes 3 and 2 vibrate at frequencies of $\omega_1$ and $\omega_2$, respectively. Various frequency components are detected out of the output of the sense electrode 2 as different output signals so as to correct the output of the electrode 2.

Assume that the chopper electrode 3 vibrates with an amplitude of $\Delta S$ while the sense electrode 2 vibrates with an amplitude of $\Delta L$, and that the electrodes 3 and 2 respectively vibrate for $\Delta L \cdot \sin\omega_1 t$ and $\Delta L \cdot \sin_2\omega$ with respect to time. Then, electrostatic capacity $C_t$ varying with the elapse of time due to the periodic mechanical vibration is expressed as:

$$C_t = \epsilon_{air} \cdot (S - \Delta S \cdot \sin\omega_1 t)/(L - \Delta L \cdot \sin\omega_2 t) \qquad \text{Eq. (6)}$$

The Eq. (6) may be modified as:

$$C_t=(\varepsilon_{air}S/L)\cdot(1-(\Delta S/S)\cdot\sin\omega_1 t)\cdot(1-(\Delta L/L)\sin\omega_2 t) \quad \text{Eq. (7)}$$

At the right side of the Eq. (7), $(\Delta L/L)\cdot\sin\omega_2 t$ is physically limited to a range:

$$|(\Delta L/L)\cdot\sin\omega_2 t|<1 \quad \text{Eq. (7')}$$

Therefore, the right side of the Eq. (7) can be mathematically expanded in a Taylor series as:

$$\begin{aligned}C_t &= (\varepsilon_{air}S/L)\cdot(1-(\Delta S/S)\cdot\sin\omega_1 t)\cdot \\ &\quad (1+(\Delta L/L)\sin\omega_2 t+(\Delta L/L)^2\cdot\sin^2\omega_2 t+\ldots) \\ &= C_0\cdot\{1+(\Delta L/L)\cdot\sin\omega_2 t-(\Delta S/S)\cdot\sin\omega_1 t+ \\ &\quad (\Delta L/L)^2\cdot\sin^2\omega_2 t-(\Delta S/S)\cdot(\Delta L/L)\cdot\sin\omega_1 t\cdot \\ &\quad \sin\omega_2 t-(\Delta S/S)\cdot(\Delta L/L)^2\cdot\sin\omega_1 t\cdot\sin_2\omega t+\ldots\}\end{aligned} \quad \text{Eq. (8)}$$

As for time, a plurality of frequency components including the term of zeroth order, the term of first order (each electrode varies for a period of time of $\sin\omega_1 t\cdot\sin\omega_2 t$) and the term of higher orders appear in $C_t$.

A charge $Q_t$ to be induced on the sense electrode 2 is obtained from $C_t$ and the surface potential $V_S$ of the object 1, as follows:

$$\begin{aligned}Q_t &= C_t\cdot V_S \\ &= C_0\cdot\{1+(\Delta L/L)\cdot\sin\omega_2 t-(\Delta S/S)\cdot\sin\omega_1 t+ \\ &\quad (\Delta L/L)^2\cdot\sin^2\omega_2 t-(\Delta S/S)\cdot(\Delta L/L)\cdot \\ &\quad \sin\omega_1 t\cdot\sin\omega_2 t-(\Delta S/S)\cdot(\Delta L/L)^2\cdot\sin\omega_1 t\cdot \\ &\quad \sin^2\omega_2 t+\ldots\}\end{aligned} \quad \text{Eq. (9)}$$

A current $I_t$ to flow through the sense electrode 2 is produced from the Eq. (9) as:

$$\begin{aligned}I_t &= dQ_t/dt \\ &= C0\cdot\{\omega_2\cdot(\Delta L/L)\cdot\cos\omega_2 t-\omega_1\cdot(\Delta S/S)\cdot\cos\omega_1 t+ \\ &\quad \omega_2\cdot(\Delta L/L)^2\cdot\sin^2\omega_2 t-(\Delta S/S)\cdot(\Delta L/L)\cdot \\ &\quad \omega_1\cdot\omega_2\cdot\sin\omega_1 t\cdot\cos\omega_2 t+\ldots\}\cdot V_S\end{aligned} \quad \text{Eq. (10)}$$

A potential signal $V_t$ output from the sense electrode 2 is expressed as:

$$\begin{aligned}V_t &= A_0\cdot C_0\cdot V_S\cdot\{\omega_2\cdot(\Delta L/L)\cdot\cos\omega_2 t- \\ &\quad \omega_1\cdot(\Delta S/S)\cdot\cos\omega_1 t+\omega_2\cdot(\Delta L/L)^2\cdot\sin^2\omega t- \\ &\quad (\Delta S/S)\cdot(\Delta L/L)\cdot\omega_1\cdot\omega_2\cdot\sin\omega_1 t\cdot\cos\omega_2 t+\ldots\}\end{aligned} \quad \text{Eq. (11)}$$

where $A_0$ is a constant relating to the amplification.

As the Eq. (11) indicates, a plurality of different frequency components varying in accordance with the distance L appear in the potential signal output form the sense electrode 2. Therefore, by detecting such different frequency components as different output signals, it is possible to obtain, with a single sense electrode, a plurality of output signals varying in accordance with the distance L. The different output signals can be used to correct the fluctuation of the potential signal ascribable to that of the distance L.

The frequency components of second and successive orders appearing in the output of the potential signal $V_t$ are neglected because their output levels are relatively low. That is, only the frequency components of first order are used as output signals. With this scheme, it is possible to detect the output signals efficiently with a sufficient S/N ratio, and therefore to obtain a sufficiently accurate surface potential output. Detecting only the frequency components of first order out of the potential signal $V_t$ is approximated as:

$$V_t=A_0\cdot C_0\cdot V_S\cdot\{\omega_2\cdot(\Delta L/L)\cdot\cos\omega_2 t-\omega_1\cdot(\Delta S/S)\cdot\cos\omega 1 t\} \quad \text{Eq. (12)}$$

By selectively detecting the frequency components $\omega_1$ and $\omega_2$ of the Eq. (12), it is possible to produce two output signals $V_1$ and $V_2$ each having a particular frequency.

How the above two output signals $V_1$ and $V_2$ are used to correct the fluctuation of the potential signal $V_t$ ascribable to that of the distance L and to thereby produce an accurate surface potential is as follows.

A first method for the correction is as follows. The distance L is determined unconditionally from the output signals $V_1$ and $V_2$ without depending on the surface potential $V_S$. Then, an accurate surface potential is produced on the basis of the determined distance. Specifically, the sizes (values) $|V_1|$ and $|V_2|$ of the output signals $V_1$ and $V_2$ are produced from the Eq. (12) as:

$$|V_1|=A_0\cdot C_0\cdot\omega_1\cdot(\Delta S/S)\cdot V_S \quad \text{Eq. (13)}$$

$$|V_2|=A_0\cdot C_0\cdot\omega_2\cdot(\Delta L/L)\cdot V_S \quad \text{Eq. (14)}$$

To determine the distance L unconditionally, the ratio between $|V_1|$ and $|V_2|$ is produced. For example, a ratio $|V_2|/|V_1|$ is given by the Eqs. (13) and (14) as:

$$|V_2|/|V_1|=(\omega_2/\omega_1)\cdot(\Delta L/\Delta S)\cdot(S/L) \quad \text{Eq. (15).}$$

The above ratio therefore can be represented by a linear function F(L) with respect to the distance L.

Figure 4A:
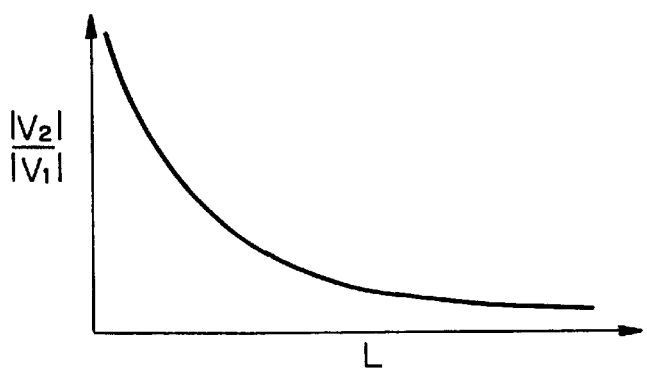
FIGS. 4A and 4B are graphs each showing a relation between a distance between an object and a sense electrode and a ratio between output signals of different frequencies.

FIG. 4A shows a curve representative of a relation between the distance L and the ratio $|V_2|/|V_1|$. In this manner, if the ratio $|V_2|/|V_1|$ is determined, the distance L can be determined unconditionally without depending on the surface potential $V_S$.

Alternatively, if a ratio $|V_1|/|V_2|$ is used, then it is expressed as:

$$|V_1|V_2|=(\omega_1/\omega_2)\cdot(\Delta S/\Delta L)\cdot(L/S) \quad \text{Eq. (16)}$$

Figure 4B:
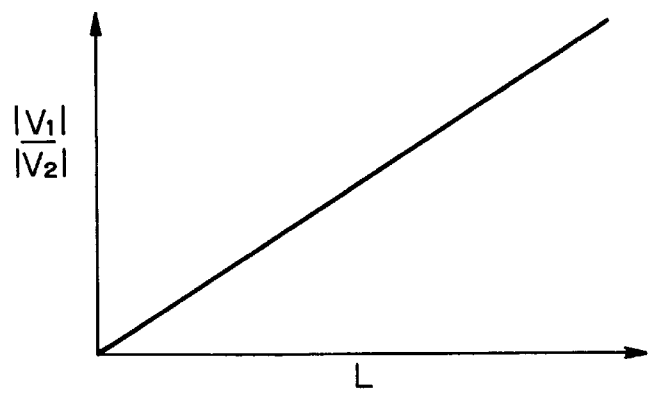

This ratio can also be represented by a linear function F(L) with respect to the distance L. FIG. 4B shows a curve representative of a relation between the distance L and the ratio $|V_1|/|V_2|$. Again, if the ratio $|V_1|/|V_2|$ is determined, the distance L can be determined unconditionally without depending on the surface potential $V_S$.

The output $|V_1|$ or $|V_2|$ is corrected on the basis of the distance L determined unconditionally and the known relation between $|V_1|$ or $|V_2|$ and L. Further, a surface potential $V_S$ corresponding to the corrected $|V_1|$ or $|V_2|$ is determined on the basis of the known relation between the surface potential $V_S$ and the value $|V_1|$ or $|V_2|$. As a result, the accurate surface potential of the object 1 is produced. Alternatively, the determined distance L may be substituted for the Eq. (13) or (14) so as to determine the surface potential unconditionally.

A second method for the correction is as follows. Because the output signals $V_1$ and $V_2$ vary in accordance with the distance L, computation for cancelling the variable of the distance L is effected by use of the values $|V_1|$ and $|V_2|$ such that the surface potential does not depend on the distance L. For example, $|V_1|$ of the Eq. (13) and detected with the Eq. (12) is squared and then divided by $|V_2|$ of the Eq. (14):

$$|V_1|^2/|V_2|=(A_0 \cdot \epsilon_{air}/S) \cdot (\omega_1^2/\omega_2) \cdot (\Delta S^2/\omega_2) \cdot (\Delta S^2/\Delta L) \cdot V_S \quad \text{Eq. (17)}$$

The Eq. (17) gives an output value corresponding to the surface potential $V_S$ of the object 1 and not dependent on the distance L. It is therefore possible to obtain an accurate surface potential on the basis of the relation between the output of the Eq. (17) and the surface potential $V_S$. Alternatively, $|V_2|$ of the Eq. (14) may be squared and then divided:

$$|V_2|/|V_1|^2=(S/A_0 \cdot \epsilon_{air}) \cdot (\omega_2/\omega_1^2) \cdot (\Delta L/\Delta S^2) \cdot (1/V_S) \quad \text{Eq. (18)}$$

This also produces an accurate surface potential based on the relation between the output of the Eq. (18) and the surface potential $V_S$.

When the Eq. (15) is used, $|V_1|$ of the Eq. (13) may be divided by the output of the Eq. (15) to produce the result of the Eq. (17), or the output of the Eq. (15) may be divided by $|V_1|$ of the Eq. (13) to produce the result of the Eq. (18). This also produces an accurate surface potential. This is also true when $|v_2|$ of the Eq. (14) is divided by the square of the output of the Eq. (15) or when the output of the Eq. (15) is squared and then divided by $|V_2|$ of the Eq. (14).

On the other hand, when the Eq. (16) is used $|V_1|$ of the Eq. (13) may be multiplied by the output of the Eq. (16), or $|V_2|$ of the Eq. (14) may be multiplied by the square of the output of the Eq. (16). As a result, the output of the Eq. (17) representative of an accurate surface potential is achieved.

FIGS. 5–10 each shows specific circuitry for correcting the fluctuation of the potential signal ascribable to that of the distance L by use of the output signals of different frequencies, and thereby producing an accurate output signal matching the surface potential of the object 1. Briefly, the circuitry of FIG. 5 produces the distance L unconditionally from the output signals $V_1$ and $V_2$ without depending on the surface potential $V_S$ of the object 1, and then determines an accurate surface potential based on the distance L. The circuitry shown in FIGS. 6–10 each executes the computation using $|V_1|$ and $|V_2|$ as not to depend on the distance L and thereby produces an accurate surface potential.

Specifically, in FIG. 5, the potential signal detection 4 detects a subtle change in the amount of charge induced on the sense electrode 2 in the form of an AC signal. Output signal detections 6a and 6b constitute the output detecting means 6, and each detects one of the two output signals $V_1$ and $V_2$ having a particular frequency out of the AC signal. The surface potential outputting means consists of a distance detection 8 and an output correction 9 and receives the signals $V_1$ and $V_2$. The distance detection 8 determines a distance based on the ratio between the signals $V_1$ and $V_2$. The output correction 9 corrects the values of the output signals on the basis of the determined distance. As a result, a signal $V_0$ representative of an accurate surface potential is produced. The potential signal detection 4 may be implemented as an AC signal amplifying circuit including a field effect transistor and an operational amplifier. The output signal detections 6a and 6b may each be implemented as a synchronous detecting circuit, demodulating circuit or a band-pass filter circuit. For the distance detection 8, use may be made of an analog multiplying or dividing circuit, an analog-to-digital converter, or computer. Further, the output correction 9 may be implemented as a computer or a digital-to-analog converter.

The circuitry shown in FIG. 6 is identical with the circuitry of FIG. 5 as to the potential signal detection 4 and output detecting means 6. In FIG. 6, the surface potential outputting means is implemented by a $|V_1|^2$ computation 10 and a $|V_1|^2$ and $|V_2|$ division 11. The computation 10 and division 11 cooperate to perform the previously stated computation with the values $|V_1|$ and $|V_2|$ of the output signals $V_1$ and $V_2$. An accurate surface potential output signal $V_0$ not dependent on the distance L is produced from the output of the division 11. For the computation 10 and division 11, use may be made of an analog multiplying or dividing circuit, analog-to-digital converter, computer, or digital-to-analog converter.

The circuitry shown in FIG. 7 is identical with the circuitry of FIG. 5 except for the following. The surface potential outputting means is implemented as a $|V_2|/V_1|$ computation 12 and a $|V_2|/V_1|$ and $|V_1|$ division 13. The computation 12 and division 13 cooperate to produce a surface potential output signal $V_0$ not dependent on the distance L. The computation 12 and division 13 may each be constructed in the same manner as in FIG. 6.

The circuitry shown in FIG. 8 is identical with the circuitry of FIG. 5 except for the following. The surface potential outputting means is implemented as a $(|V_2|/|V_1|)^2$ computation 14 and a $(|V_2|/|V_1|)^2$ and $|V_2|$ division 15. The computation 14 and division 15 cooperate to produce a surface potential output signal $V_0$ not dependent on the distance L. The computation 14 and division 15 may each be constructed in the same manner as in FIG. 6.

The circuitry shown in FIG. 9 is identical with the circuitry of FIG. 5 except for the following. The surface potential outputting means is implemented as a $|V_1|/|V_2|$ computation 16 and a $|V_1|/|V_2|$ and $|V_1|$ multiplication 17 to produce a surface potential output signal $V_0$ not dependent on the distance L. The computation 16 and multiplication 17 may each be constructed in the sane manner as in FIG. 6.

The circuitry shown in FIG. 10 is identical with die circuitry of FIG. 5 except for the following. The surface potential outputting means is implemented as a $(|V_1|/|V_2|)^2$ computation 18 and a $(|V_1|/|V_2|)^2$ and $|V_2|$ multiplication 19. to produce a surface potential output signal $V_0$ not dependent on the distance L. The computation 18 and multiplication 19 may each be constructed in the same manner as in FIG. 6.

Figure 11A:
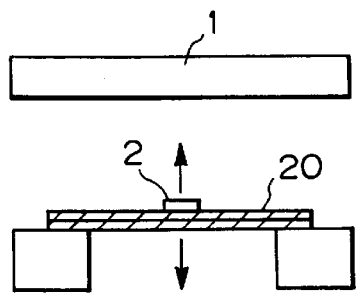
FIGS. 11A–11D each shows a specific configuration of electrode vibrating means for causing a sense electrode (or chopper electrode) to vibrate at different frequencies.
Figure 11B:
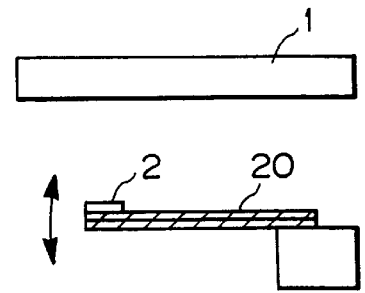

FIGS. 11A–11D each shows specific electrode vibrating means for varying the capacitance between the object 1 and the sense electrode 2 with different frequencies, i.e., for causing a chopper electrode or a sense electrode to vibrate at different frequencies. In FIGS. 11A–11D, all the vibrating means cause the sense electrode 2 to vibrate. In FIG. 11A, the vibrating means uses a unimorph type piezoelectric actuator 20 (see FIG. 12A) or a bimorph type piezoelectric actuator 20 (see FIG. 12B. The actuators 20 are each made up of PZT or similar piezoelectric material 20a and a metallic spring 20b and is supported at both ends thereof. When a voltage is applied to the piezoelectric material 20a, the material 20a deforms and causes the sense electrode 2 mounted on the actuator 20 to vibrate. The actuator 20 shown in FIG. 11B is identical with the actuator 20 of FIG. 11A except that it is cantilevered.

In FIG, 11C, the sense electrode 2 is mounted on a magnet 22 surrounded by an electromagnetic coil 21. When a current I varying with the elapse of time is fed to the coil 21, the magnet 22 in the coil 21 vibrates and causes the sense electrode 2 to vibrate. In FIG. 11D, the sense electrode 2 is mounted an a voice coil 24. In the illustrative embodiment, the voice coil refers to one consisting of an electromagnetic coil 24 and resilient members 25 implemented as beam-like springs. When a current is fed to the coil 24, the coil 24 vibrates and causes the sense electrode 2 to vibrate. The width over which the sense electrode 2 vibrates is limited by the springs 25, as illustrated.

Alternatively, the sense electrode 2 may be mounted on the tip of, e.g., a tuning fork or the tip of a vibration piece. Further, a tuning fork or a vibration piece may be used as a chopper electrode, in which case the piezoelectric material or the electromagnetic coil will be adhered to the chopper electrode. In this condition, a voltage or a current will be fed to the piezoelectric material or the coil.

Among the vibrating means shown in FIGS. 11A–11D, the vibrating means using the voice coil 23 is preferable because it causes the electrode to vibrate greatly with a simple and inexpensive structure. This insures a sufficient S/N ratio and implements an accurate, efficient and simple arrangement. Regarding the voice coil 23, specific arrangements wherein the chopper electrode 3 is caused to vibrate by leaf springs 29 will be described with reference to FIGS. 13A–13F, Specific arrangements for causing the sense electrode 2 are shown in FIGS. 14A–14F. In any case, the voice coil 23 is mounted on a stationary base 30 via the leaf springs 29. The chopper electrode 3 or the sense electrode 2 is mounted on a solenoid coil 27 or a permanent magnet 28 included in the voice coil 23. In this condition, the electrode 3 or 2 can be caused to vibrate. To reduce the weight of the voice coil 23 and to promote easy fabrication, a coil bobbin 26 may be omitted so as to cause the solenoid coil 27 and electrode to vibrate. Therefore, when the voice coil 23 is used, it is possible to obtain two signals of different frequencies from the sense electrode 2 by combining any one of the vibrating means shown in FIGS. 13A–13F and any one of the vibrating means shown in FIGS. 14A–14F.

In the illustrative embodiment, only the first order frequency components suffice to produce an accurate surface potential with high efficiency, as stated above. When higher accuracy of measurement is desired, higher order frequency components may be used in addition to the first order components. Further, to enhance reliability, two or more sense electrodes may be used, in which case the above method and means for measurement will be assigned to each of them.

2nd Embodiment

Figure 15:
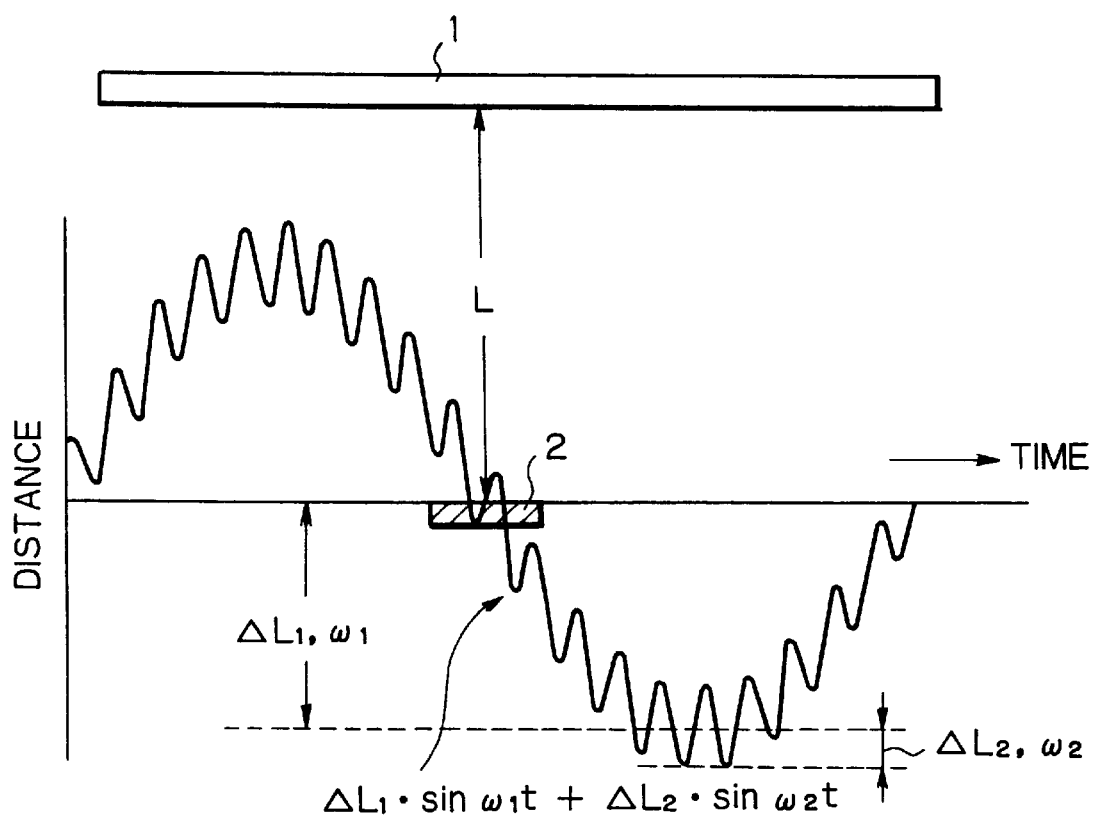
FIG. 15 shows a second embodiment of the present invention.

An embodiment to be described uses only the sense electrode 2 for the correction of the fluctuation of the potential signal. As shown in FIG. 15, the sense electrode 2 is caused to vibrate periodically and sinusoidally with the different frequency components $\omega_1$ and $\omega_2$ added together. Again, the different frequency components are detected car of the potential signal output from the sense electrode 2 in order to correct the potential signal.

Assume that the sense electrode 2 vibrates with an amplitude of $\Delta L_1$ for the vibration $\omega_1$ and with an amplitude of $\Delta L_2$ for the vibration $\omega_2$, and that the electrode 2 vibrates for $\Delta L_1 \cdot \sin\omega_1 t + L_2 \cdot \sin\omega_2$ with respect to time. Then, an electrostatic capacitance $C_t$ varying with the elapse of time due to the periodic mechanical vibration is expressed as:

$$C_t = \epsilon_{air} \cdot S(L - (\Delta L_1 \cdot \sin\omega_1 t + \Delta L_2 \cdot \sin\omega_2 t)) \qquad \text{Eq. (19)}$$

The Eq. (19) may be modified as:

$$C_t = (\epsilon_{air}\, S/L) \cdot \{1/(1 - (\Delta L_1 \cdot \sin\omega_1 t + \Delta L_2\, \sin\omega_2 t))/L)\} \qquad \text{Eq. (20)}$$

At the right side of the Eq. (20). $((\Delta L_1 \cdot \sin\omega_1 t + \Delta L_2\, \sin\omega_2 t))/L$ is physically limited to a range;

$$|(\Delta L_1 \cdot \sin\omega_1 t + \Delta L_2\, \sin\omega_2 t))/L| < 1 \qquad \text{Eq. (21)}$$

Therefore, the right side of the Eq. (21) can be mathematically expanded in a Taylor series as:

$$\begin{aligned}
C_t = & (\epsilon_{air} S/L) \cdot (1 + (\Delta L_1 \cdot \sin\omega_1 t + \Delta L_2 \sin\omega_2 t))/L + \\
& ((\Delta L_1 \cdot \sin\omega_1 t + \Delta L_2 \sin\omega_2 t)/L)^2 + \ldots \} \\
= & C_0 \cdot \{1 + (\Delta L_1/L) \cdot \sin\omega_1 t + (\Delta L_2/L) \cdot \sin\omega_2 t + \\
& (\Delta L_1/L)^2 \cdot \sin^2\omega_1 t + (\Delta L_2/L) \cdot (\Delta L/L) \cdot \sin^2\omega_2 t + \\
& 2 \cdot (\Delta L_1 \cdot \Delta L_2/L_2) \cdot \sin\omega_1 t \cdot \sin^2\omega t + \ldots \}
\end{aligned} \qquad \text{Eq. (22)}$$

As for time, a plurality of frequency components including the term of zeroth order (electrode 2 remaining stationary), the term of first order (electrode 2 vibrating for periods of time of $\sin\omega_1 t$ and $\sin\omega_2 t$) and the terms of higher orders appear in $C_t$.

A charge $Q_t$ to be induced on the sense electrode 2 is obtained from $C_t$ and the surface potential $V_S$ of the object 1, as follows:

$$\begin{aligned}
Q_t = & C_t \cdot V_S \\
= & C_0 \cdot \{1 + (\Delta L_1/L) \cdot \sin\omega_1 t + (\Delta L_2/L) \cdot \sin\omega_2 t + \\
& (\Delta L_1/L)^2 \cdot \sin^2\omega_1 t + 2 \cdot (\Delta L_1 \cdot \Delta L_2/L_2) \cdot \\
& \sin\omega_1 t \cdot \sin\omega_2 t + (\Delta L_2/L)^2 \cdot \sin^2\omega_2 t + \ldots \} \cdot V_S
\end{aligned} \qquad \text{Eq. (23)}$$

A current $I_t$ to flow through the sense electrode 2 is produced from the Eq. (23) as:

$$\begin{aligned}
I_t = & d\,Q_t/d\,t \\
= & C_0 \cdot \{\omega_1 \cdot (\Delta L_1/L) \cdot \cos\omega_1 t + \omega_2 \cdot (\Delta L_2/L) \cdot \cos\omega_2 t + \\
& 2\omega_1 \cdot (\Delta L_1/L)^2 \cdot \cos\omega_1 t \cdot \sin\omega_1 t + 2\omega_2 \cdot \\
& (\Delta L_1 \cdot \Delta L_2/L_2) \cdot \cos\omega_2 t \cdot \sin\omega_1 t + 2\omega_1 \cdot \\
& (\Delta L_1 \cdot \Delta L_2/L_2) \cdot \cos\omega_1 t \cdot \sin\omega_2 t + 2\omega_2 \cdot \\
& (\Delta L_2/L)^2 \cdot \cos\omega_2 t \cdot \sin\omega_2 t + \ldots \} \cdot V_S
\end{aligned} \qquad \text{Eq. (24)}$$

A potential signal $V_t$ output from the sense electrode 2 is expressed as:

$$\begin{aligned}
V_t = & A_0 \cdot C_0 \cdot V_S \{\omega_1 \cdot (\Delta L_1/L) \cdot \cos\omega_1 t + \omega_2 \cdot (\Delta L_2/L) \cdot \\
& \cos\omega_2 t + 2\omega_1 \cdot (\Delta L_1/L)^2 \cdot \cos\omega_1 t \cdot \sin\omega_1 t + \\
& 2\omega_2 \cdot (\Delta L_1 \cdot \Delta L_2/L_2) \cdot \cos\omega_2 t \cdot \sin\omega_1 t + 2\omega_1 \cdot \\
& (\Delta L_1 \cdot \Delta L_2/L_2) \cdot \cos\omega_1 t \cdot \sin\omega + 2\omega_2 \cdot \\
& (\Delta L_2/L)^2 \cdot \cos\omega_2 t \cdot \sin\omega_2 t + \ldots \} \cdot V_S
\end{aligned} \qquad \text{Eq. (25)}$$

where $A_0$ is a constant relating to the amplification.

As the Eq. (25) indicates, a plurality of different frequency components varying in accordance with the distance L appear in the potential signal output form the sense electrode 2. Therefore, by detecting such different frequency components as different output signals, it is possible to obtain, with a single sense electrode, a plurality of output signals varying in accordance with the distance L. The different output signals can be used to correct the fluctuation of the potential signal ascribable to that of the distance L.

The frequency components of third and successive orders appearing in the output of the potential signal $V_t$ are neglected because their output levels are relatively low. That is, only the frequency components of first and second orders are used as output signals. With this scheme, it is possible to detect the output signals efficiently with a sufficient S/N ratio, and therefore to obtain a sufficiently accurate surface potential output. Detecting only the frequency components of first and second orders out of the potential signal $V_t$ of the Eq. (25) is approximated as:

$$V_t \approx A_0 \cdot C_0 \cdot V_S \cdot \{\omega_1 \cdot (\Delta L_1/L) \cdot \cos\omega_1 t + \omega_2 \cdot (\Delta L_2/L) \cdot \cos\omega_2 t + \omega_1 \cdot (\Delta L_1/L)^2 \cdot \sin^2\omega_1 t + \omega_2 \cdot (\Delta L_1 \cdot \Delta L_2/L_2) \cdot (\sin(\omega_2 + \omega_1)t - \sin(\omega_2 - \omega_1)t) + \omega_1 \cdot (\Delta L_1 \cdot \Delta L_2/L_2) \cdot (\sin(\omega_2 + \omega_1)t + \sin(\omega_2 - \omega_1)t) + \omega_2 \cdot (\Delta_2/L)^2 \cdot \sin^2\omega_2 t\} \quad \text{Eq. (26)}$$

By detecting the frequency components $\omega_1$, $\omega_2$, $2\omega_1$, $2\omega_2$, $\omega_2+\omega_1$ and $\omega_2-\omega_1$ included in tie Eq. (26), it is possible to attain six output signals of different frequencies.

In this embodiment, assume $\omega_1 \ll \omega_2$ and $(\Delta L_2/L)^1 \ll 1$, and let the Eq. (26) be further simplified as:

$$V_t \approx A_0 \cdot C_0 \cdot V_S \cdot \{\omega_2 \cdot (\Delta L_2/L) \cdot \cos\omega_2 t + \omega_2 \cdot (\Delta L_1 \cdot \Delta L_2/L_2) \cdot (\sin(\omega_2 + \omega_1)t - \sin(\omega_2 - \omega_1)t) + \omega_1 \cdot (\Delta L_1 \cdot \Delta L_2/L_2) \cdot (\sin(\omega_2 + \omega_1)t + \sin(\omega_2 - \omega_1)t) + \omega_2 \cdot (\Delta L_1 \cdot \Delta L_2/L_2) \cdot (\sin(\omega_2 + \omega_1)t - \sin(\omega_2 - \omega_1)t)\} \quad \text{Eq. (27)}$$

In this condition, by selecting only the frequency components $\omega_2$ and $\omega_2+\omega_1$ (or $\omega_2-\omega_2$), it is possible to attain two output signals $V_1$ and $V_2$ of different frequencies efficiently with a sufficient S/N ratio.

How the above two output signals $V_1$ and $V_2$ are used to correct the fluctuation of the potential signal $V_t$ ascribable to that of the distance L and to thereby produce an accurate surface potential.

A first method for the correction is as follows. The distance L is unconditionally determined from the output signals $V_1$ and $V_2$ without depending on the surface potential VS. Then, an accurate surface potential is produced on the basis of the determined distance. Specifically, the sizes (values) $|V_1|$ and $|V_2|$ of the output signals $V_1$ and $V_2$ are given by the Eq. (27) as:

$$|V_1| = A_0 \cdot C_0 \cdot \omega_2 \cdot (\Delta L_2/L) \cdot V_S \quad \text{Eq. (28)}$$

$$|V_2| = A_0 \cdot C_0 \cdot (\omega_2+\omega_1) \cdot (\Delta L_1 \cdot \Delta L_2/L_2)) \cdot V_S \quad \text{Eq. (29)}$$

To determine the distance L unconditionally, the ratio between $|V_1|$ and $|V_2|$ is produced. For example, a ratio $|V_2|/|V_1|$ is given by the Eqs. (28) and (29) as:

$$|V_2|/|V_1| = ((\omega_2+\omega_1)/\omega_2) \cdot (\Delta L_1/L) \quad \text{Eq. (30)}$$

The above ratio therefore can be represented by a linear function F(L) with respect to the distance L.

FIG. 4A shows a curve representative of a relation between the distance L and the ratio $|V_2|/|V_1|$. In this manner, if the ratio $|V_2|/|V_1|$ is determined, the distance L can be determined unconditionally without depending on the surface potential $V_S$.

Alternatively, if a ratio $|V_1|/|V_2|$ is used, then it is expressed as:

$$|V_1|/|V_2| = (\omega_2/(\omega_2+\omega_1)) \cdot (L/\Delta L_1) \quad \text{Eq. (31)}$$

This ratio can also be represented by a linear function F(L) with respect to the distance L. FIG. 4B shows a curve representative of a relation between the distance L and the ratio $|V_1|/|V_2|$. Again, if the ratio $|V_1|/|V_2|$ is determined, the distance L can be determined unconditionally without depending on the surface potential $V_S$.

The output $|V_1|$ or $|V_2|$ is corrected on the basis of the distance L determined unconditionally and the known relation between $|V_1|$ or $|V_2|$ and L. Further, a surface potential $V_S$ corresponding to the corrected $|V_1|$ or $|V_2|$ is determined on the basis of the known relation between the surface potential $V_S$ and the value $|V_1|$ or $|V_2|$. As a result, the accurate surface potential of the object 1 is produced. Alternatively, the determined distance L may be substituted for the Eq. (28) or (29) so as to determine the surface potential unconditionally.

A second method for the correction is as follows. Because the output signals $V_1$ and $V_2$ vary in accordance with the distance L, computation for cancelling the variable of the distance L is effected by use of the values $|V_1|$ and $|V_2|$ such that the surface potential does not depend on the distance L. For example, $|V_1|$ of the Eq. (28) and detected with the Eq. (27) is raised to third power and then divided by the square of $|V_2|$ of the Eq. (29).

$$|V_1|^3/|V_2|^2 = A_0 \cdot \epsilon_{air} \cdot S \cdot (\omega_2^3/\omega_2+\omega_1)^2) \cdot (\Delta L_2/\Delta L_1^2) \cdot V_S \quad \text{Eq. (32)}$$

The Eq. (32) gives an output value corresponding to the surface potential $V_S$ of the object 1 and not dependent on the distance L. It is therefore possible to obtain an accurate surface potential on the basis of the relation between the output of the Eq. (32) and the surface potential $V_S$. Alternatively, $|V_2|$ of the Eq. (29) may be squared and then divided by the third power of $|V_1|$ of the Eq. (28):

$$|V_2|^2/|V_1|^3 = (\omega_2+\omega_1)^2/(A \cdot \epsilon_{air} \cdot S \cdot \omega_2^3)) \cdot (\Delta L_1^2/\Delta L_2) \cdot (1/V_S) \quad \text{Eq. (33)}$$

This also provides an accurate surface potential based on the relation between the output of the Eq. (33) and the surface potential $V_S$.

When the Eq. (30) is used, $|V_1|$ of the Eq. (28) may be divided by the square of the output of the Eq. (30) to produce the result of the Eq. (32), or the square of the output of the Eq. (30) may be divided by $|V_1|$ of the Eq. (28) to produce the result of the Eq. (33). This also produces an accurate surface potential. This is also true when $|V_2|$ of the Eq. (29) is divided by the third power of the output of the Eq. (30) or when the output of the Eq. (30) is raised to third power and then divided by $|V_2|$ of the Eq. (29).

On the other hand, when the Eq. (31) is used, $|V_1|$ of the Eq. (28) may be multiplied by the square of the output of the Eq. (30), or $|V_2|$ of this Eq. (29) may be multiplied by the third power of the output of the Eq. (31). As a result, the output of the Eq. (32) representative of an accurate surface potential is achieved.

The specific circuitry described with reference to FIG. 5 is also applicable to this embodiment as the device for correcting the fluctuation of the output of the potential signal on the basis of a plurality of output signals of different frequencies and thereby producing an accurate output signal. A reference will be made to FIGS. 16–20 for describing specific circuitry for performing, with the values $|V_1|$ and $|V_2|$, the computation not dependent on the distance L and thereby outputting an accurate surface potential.

In FIG. 16, the potential signal detection 4 detects a subtle change in the amount of charge induced on the sense electrode 2 in the form of an AC signal. The output signal detections 6a and 6b each detects one of the two output signals $V_1$ and $V_2$ having a particular frequency out of the AC signal. The surface potential outputting means is implemented by a $|V_1|^3$ computation 31, a $|V_2|^2$ computation 32, and a $|V_2|^3$ and $|V_2|^2$ division 33. The potential signal detection 4 and sign detections 6a and 6b way be constructed in the same manner as in FIG. 5. The computations 31 and 32 and division 33 cooperate to perform the previously stated computation with the values $|V_1|$ and $|V_2|$ of the output signals $V_1$ and $V_2$. An accurate surface potential output signal $V_0$ not dependent on the distance L is produced from the output of the division 33. For the computation 31 and 32 and division 33, use may be made of an analog multiplying or dividing circuit, analog-to-digital converter, computer, or digital-to-analog converter.

The circuitry shown in FIG. 17 is identical with the circuitry of FIG. 16 except for the following. The surface potential outputting means is implemented as a $(|V_2|/|V_1|)^2$ computation 34 and a $(|V_2|/|V_1|)^2$ and $|V_1|$ division 35. The computation 34 and division 35 cooperate to produce a surface potential output signal $V_0$ not dependent on the distance L. For the potential signal detection 4 and detections 6a and 6b may be implemented by any one of the means described with reference to FIG. 5. The computation 34 and division 35 may each be constructed in the same manner as in FIG. 16.

The circuitry shown in FIG. 18 is identical with the circuitry of FIG. 16 except for the following. The surface potential outputting means is implemented as a $(|V_2|/|V_1|)^3$ computation 36 and a $(|V_2|/|V_1|)^3$ and $|V_2|$ division 37. The computation 36 and division 37 cooperate to produce a surface potential output signal $V_0$ not dependent on the distance L. For the potential signal detection 4 and detections 6a and 6b may be implemented by any one of the means described with reference to FIG. 5. The computation 36 and division 37 may each be constructed in the same manner as in FIG. 16.

The circuitry shown in FIG. 19 is identical with the circuitry of FIG. 5 except for the following. The surface potential outputting means is implemented as a $(|V_1|/|V_2|)^2$ computation 38 and a $(|V_1|/|V_2|)^2$ and $|V_1|$ multiplication 39 to produce a surface potential output signal V0 not dependent on the distance L. For the potential signal detection 4 and detections 6a and 6b may be implemented by any one of the means described with reference to FIG. 5. The computation 38 and multiplication 39 may each be constructed in the same manner as in FIG. 16.

Figure 20:
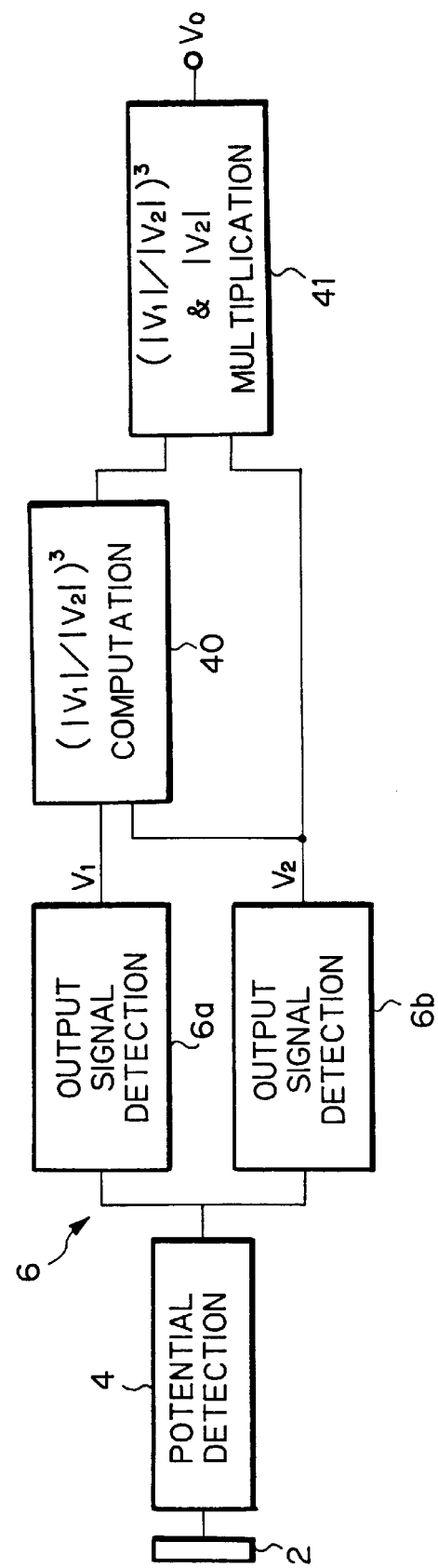

The circuitry shown in FIG. 20 is identical with the circuitry of FIG. 16 except for the following. The surface potential outputting means is implemented as a $(|V_1|/|V_2|)^3$ computation 40 and a $(|V_1|/|V_2|)^3$ and $|V_2|$ multiplication 41 to produce a surface potential output signal $V_0$ not dependent on the distance L. The potential signal detection 4 and detections 6a and 6b may be implemented by any one of the means described with reference to FIG. 5. The computation 40 and multiplication 41 may each be constructed in the same manner as in FIG. 16.

In this embodiment, the means for causing the sense electrode 2 to vibrate at different frequencies or to change the electrostatic capacitance may also be implemented by any one of the specific configurations shown in FIGS. 11A–11D. The difference is that in this embodiment a drive voltage (or current) shown in FIG. 21A specifically and a drive voltage (or current) shown in FIG. 21B specifically are superposed on each other. The waveforms shown in FIGS. 21A and 21B have frequencies $\omega_1$ and $\omega_2$, respectively. FIG. 21C shows the resulting superposed waveform. The waveform of FIG. 21C is applied to the electrode vibrating means. This allows single electrode vibrating means to vibrate the sense electrode 2 at different frequencies.

Figure 11C:
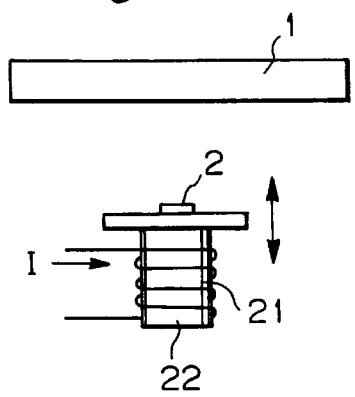
Figure 11D:
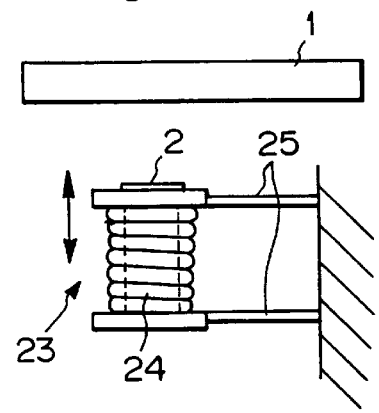
Figure 12A:
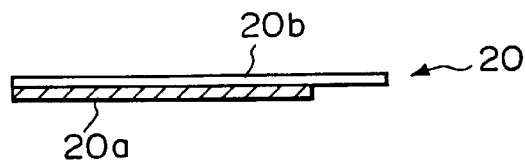
FIGS. 12A and 12B each shows a specific configuration of a piezoelectric actuator shown in FIGS. 11A–11D.
Figure 12B:
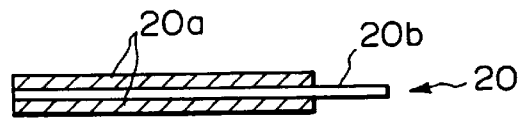
Figure 13A:
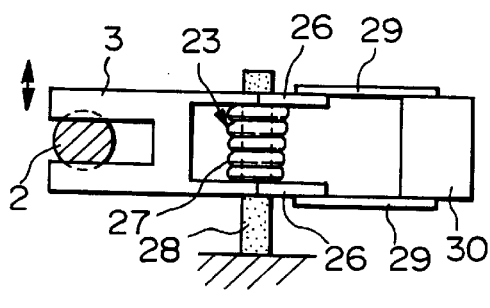
FIGS. 13A–13F each shows another specific configuration of the electrode vibrating means using a voice coil.
Figure 13B:
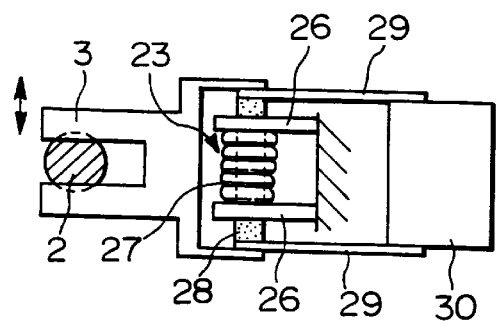
Figure 13C:
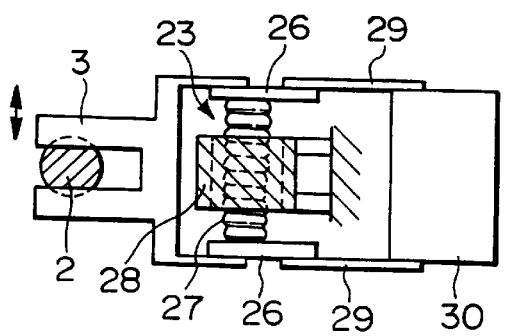
Figure 13D:
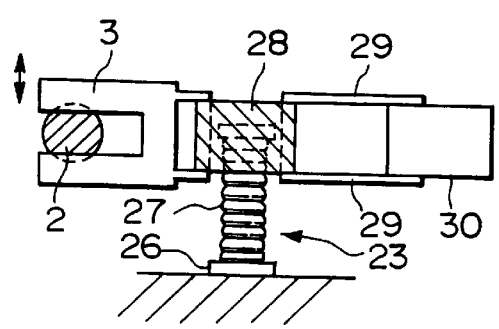
Figure 13E:
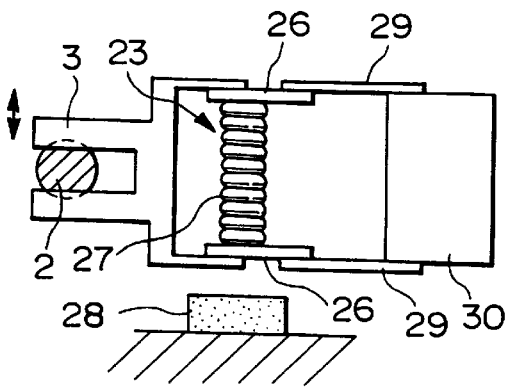
Figure 13F:
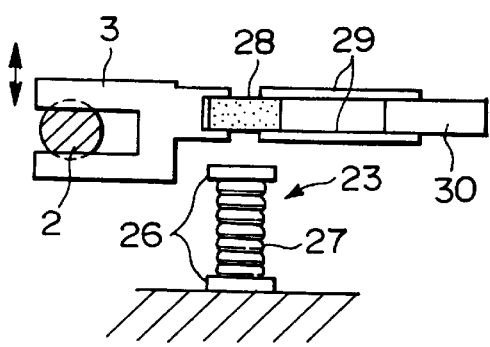
Figure 14A:
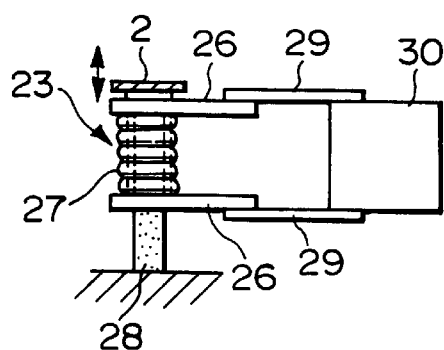
FIGS. 14A–14F each shows another specific configuration of the electrode vibrating means using a voice coil.
Figure 14B:
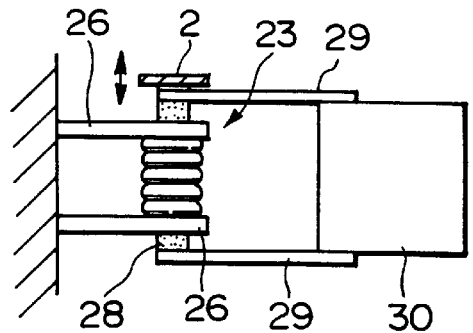
Figure 14C:
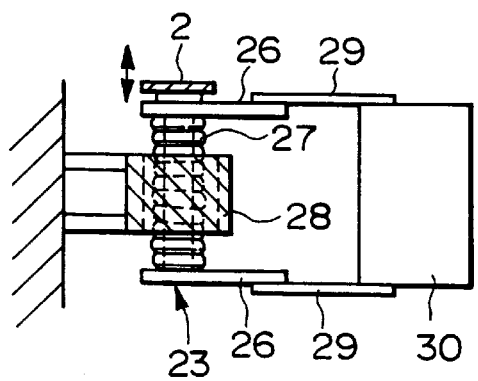
Figure 14D:
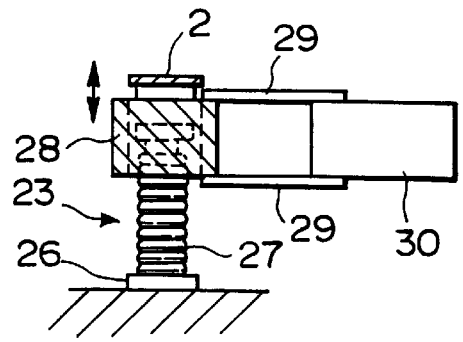
Figure 14E:
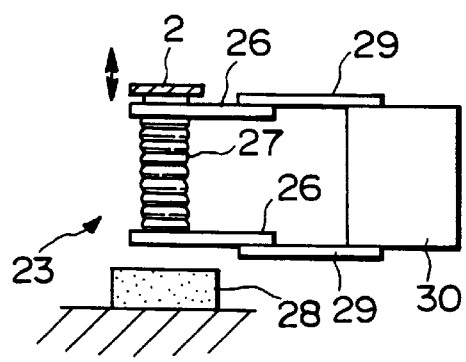
Figure 14F:
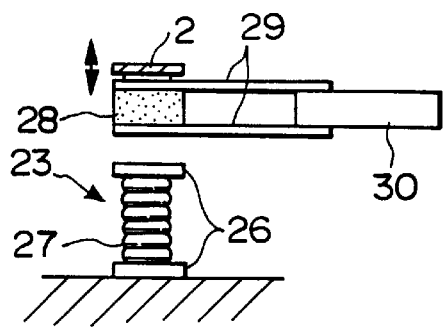

FIGS. 22A–22I show alternative arrangements in which two of the electrode vibrating means of FIGS. 11A–11C (piezoelectric actuator 20, electromagnetic coil 21, etc.) are combined. Specifically, the drive voltage or current having the frequency $\omega_1$, FIG. 21A, and the drive voltage or current having the frequency $\omega_2$, FIG. 21B, are respectively applied to the two vibrating means at the same time, thereby causing the electrode 2 to vibrate with the waveform shown in FIG, 15. In each of FIGS. 21A–22H, the actuator 20 may be replaced with the previously mentioned tuning fork or the vibration piece to which a flat piezoelectric material or an electromagnetic coil is adhered.

Again, among the vibrating means shown in FIGS. 11A–11D, the vibrating means using the voice coil 23 is preferable because it causes the electrode to vibrate greatly with a simple and inexpensive structure. This insures a sufficient S/N ratio and implements an accurate, efficient and simple arrangement. The voice coil may be arranged in any one of the specific configurations shown in 14A–14F.

In the illustrative embodiment, only the first and second order frequency components suffice to produce an accurate surface potential with high efficiency, as stated above. When higher accuracy of measurement is desired, the third and successive order frequency components may be used in addition to the first and second order components. Further, to enhance reliability, two or more sense electrodes may be used, in which case the above method and means for measurement will be assigned to each of them.

3rd Embodiment

Figure 23:
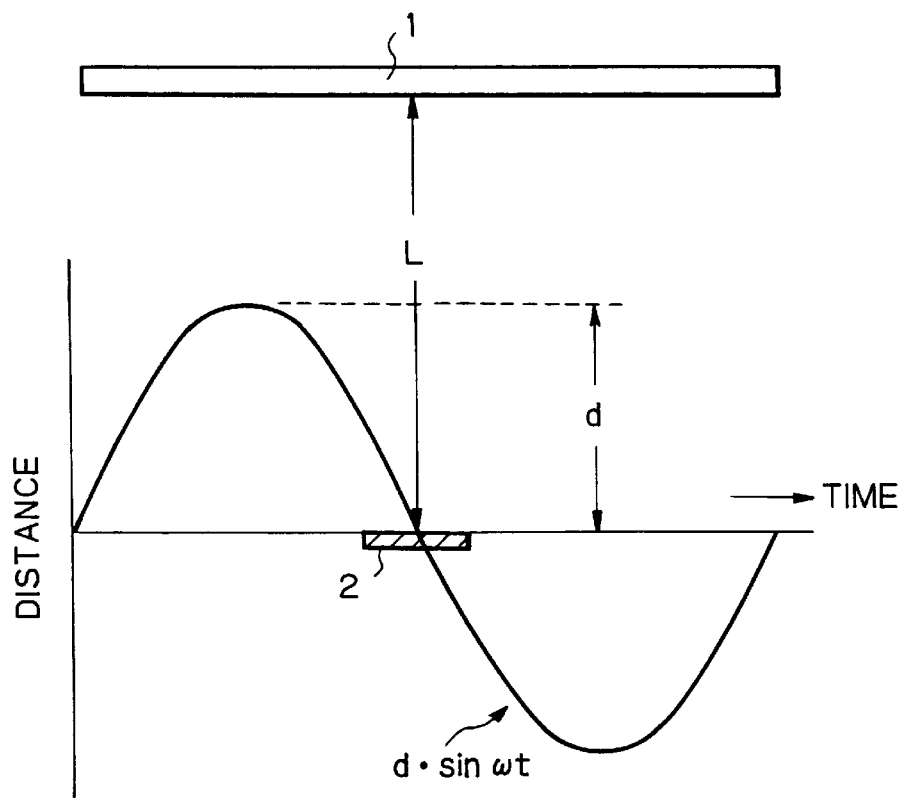
FIG. 23 shows a third embodiment of the present invention.

An embodiment to be described also uses only the sense electrode 2 for the correction of the fluctuation of the potential signal. As shown in FIG. 23, the sense electrode 2 is caused to vibrate greatly, periodically and sinusoidally at a single frequency $\omega$. Again, the resulting different frequency components are detected out of the potential signal output from the sense electrode 2 in order to correct the potential signal.

Assume that the sense electrode 2 vibrates with an amplitude of d, and that the electrode 2 vibrates for d·sin$\omega$t with respect to time. Then, an electrostatic capacitance $C_t$ varying with the elapse of time due to the periodic mechanical vibration is expressed as:

$$C_t = \epsilon_{air} \cdot S/(L - d \cdot \sin\omega t) \qquad \text{Eq. (34)}$$

The Eq. (34) may be modified as:

$$C_t = (\epsilon_{air} S/L) \cdot \{1/(1 - (d/L) \cdot \sin\omega t\} \qquad \text{Eq. (35)}$$

At the right side of the Eq. (35), $(d/L)\cdot\sin\omega t$ is physically limited to a range:

$$|(d/L)\cdot\sin\omega t|<1 \qquad \text{Eq. (36)}$$

Therefore, the right side of the Eq. (35) can be mathematically expanded in a Taylor series as:

$$C_t=(\epsilon_{air}\cdot S/L)\cdot(1+(d/L)\cdot\sin\omega t+(d/L)\cdot\sin\omega t)^2+\ldots\}=C_0\cdot\{1+(d/L)\cdot\sin\omega t+(d/L)^2\cdot\sin^2\omega t+\ldots\} \qquad \text{Eq. (37)}$$

As for time, a plurality of frequency components including the term of zeroth order (electrode 2 remaining stationary), the term of first order (electrode 2 varying for $\sin\omega t$) and the term of higher orders appear in $C_t$.

A charge $Q_t$ to be induced on the sense electrode 2 is obtained from $C_t$ and the surface potential $V_S$ of the object 1, as follows:

$$Q_t=C_t\cdot V_S=C_0\cdot\{1+(d/L)\cdot\sin\omega t+(d/L)^2\cdot\sin^\omega t+\ldots\}\cdot V_S \qquad \text{Eq. (38)}$$

A current $I_t$ to flow through the sense electrode 2 is produced from the Eq. (38) as:

$$I_t=dQ_t/dt=C_0\cdot\{\omega\cdot(d/L)\cdot\cos\omega t+\omega(d/L)^2\cdot\sin 2\omega t+\ldots\}\cdot V_S \qquad \text{Eq. (39)}$$

A potential signal $V_t$ output from the sense electrode 2 is expressed as:

$$V_t=A_0\cdot C_0\cdot V_S\cdot\{\omega\cdot d/L)\cdot\cos\omega t+\omega\cdot(d/L)^2\cdot\sin^2\omega t+\ldots\}\cdot V_S \qquad \text{Eq. (40)}$$

where $A_0$ is a constant relating to the amplification.

As the Eq. (40) indicates, a plurality of different frequency components varying in accordance with the distance L appear in the potential signal output form the sense electrode 2. Therefore, by detecting such different frequency components as different output signals, it is possible to obtain, with a single sense electrode, a plurality of output signals varying in accordance with the distance L The different output signals can be used to correct the fluctuation of the potential signal ascribable to that of the distance L.

The frequency components of third and successive orders appearing in the output of the potential signal $V_t$ are neglected because their output levels are relatively low. That is, only the frequency components of first and second orders are used as output signals. With this scheme, it is possible to detect the output signals efficiently with a sufficient S/N ratio, and therefore to obtain a sufficiently accurate surface potential output. Detecting only the frequency components of first and second orders out of the potential signal $V_t$ of the Eq. (40) is approximated as:

$$V_t \approx A_0\cdot C_0\cdot V_S\cdot\{\omega\cdot(d/L)\cdot\cos\omega t+\omega(d/L)^2\cdot\sin^2\omega t\} \qquad \text{Eq. (41)}$$

By detecting the frequency components $\omega$ and $2\omega$ included in the Eq. (41), it is possible to attain two output signals $V_1$ and $V_2$ of different frequencies.

How the above two output signals $V_1$ and $V_2$ are used to correct the fluctuation of the potential signal $V_t$ ascribable to that of the distance L and to thereby produce an accurate surface potential will be described.

A fist method for the correction is as follows. The distance L is determined unconditionally from the output signals $V_1$ and $V_2$ without depending on the surface potential $V_S$. Then, an accurate surface potential is produced on the basis of the determined distance. Specifically, the sizes (values) $|V_1|$ and $|V_2|$ of the output signals $V_1$ and $V_2$ are given by the Eq. (41) as:

$$|V_1|=A_0\cdot C\cdot\omega\cdot(d/L)\cdot V_S \qquad \text{Eq. (42)}$$

$$|V_2|=A_0\cdot C_0\cdot\omega\cdot(d/L)^2\cdot V_S \qquad \text{Eq. (43)}$$

To determine the distance L unconditionally, the ratio between $|V_1|$ and $|V_2|$ is produced. For example, a ratio $|V_2|/|V_1|$ is given by the Eqs. (42) and (43) as:

$$|V_2|/|V_1|=(d/L) \qquad \text{Eq. (44)}$$

The above ratio therefore can be represented by a linear function F(L) with respect to the distance L.

FIG. 4A shows a curve representative of a relation between the distance L and the ratio $|V_1|/|V_1|$. In this manner, if the ratio $|V_2|/|V_1|$ is determined, the distance L can be determined unconditionally without depending on the surface potential $V_S$.

Alternatively, if a ratio $|V_1|/|V_2|$ is used, then it is expressed as:

$$|V_1|/|V_2|=L/d \qquad \text{Eq. (45)}$$

This ratio can also be represented by a linear function F(L) with respect to the distance L. FIG. 4B shows a curve representative of a relation between the distance L and the ratio $|V_1|/|V_2|$. Again, if the ratio $|V_1|/|V_2|$ is determined, the distance L can be determined unconditionally without depending on the surface potential $V_S$.

The output $|V_1|$ or $|V_2|$ is corrected on the basis of the distance L determined unconditionally and the known relation between $|V_1|$ or $|V_2|$ and L. Further, a surface potential $V_S$ corresponding to the corrected $|V_1|$ or $|V_2|$ is determined on the basis of the known relation between the surface potential $V_S$ and the value $|V_1|$ or $|V_2|$. As a result, the accurate surface potential of the object 1 is produced. Alternatively, the determined distance L may be substituted for the Eq. (43) or (42) so as to determine the surface potential unconditionally.

A second method for the correction is as follows. Because the output signals $V_t$ and $V_2$ vary in accordance with the distance L, computation for cancelling the variable of the distance L is effected by use of the values $|V_1|$ and $|V_2|$ such that the surface potential does not depend on the distance L. For example, $|V_1|$ of the Eq. (42) and detect with the Eq. (41) is raised to third power and then divided by the square of $|V_2|$ of the Eq. (43):

$$|V_1|^3/|V_2|^2=A_0\cdot\epsilon_{air}\cdot S\cdot\omega\cdot(V_S/d) \qquad \text{Eq. (46)}$$

The Eq. (46) gives an output value corresponding to the surface potential $V_S$ of the object 1 and not dependent on the distance L. It is therefore possible to obtain an accurate surface potential on the basis of the relation between the output of the Eq. (46) and the surface potential $V_S$. Alternatively, $|V_2|$ of the Eq. (43) may be squared and then divided by the third power of $|V_t|$ of the Eq. (42):

$$|V_2|^2/|V1|^3=(1/(A_0\cdot\epsilon_{air}\cdot S\cdot\omega))\cdot(d/V_S) \qquad \text{Eq. (47)}$$

When the Eq. (44) is used, $|V_1|$ of the Eq. (42) may be divided by the square of the output of the Eq. (44) to produce the result of the Eq. (46), or the square of the output of the Eq. (44) may be divided by $|V_1|$ of the Eq. (42) to produce the result of the Eq. (47). This also produces an accurate surface potential. This is also true when $|V_2|$ of the Eq. (43) is divided by the third power of the output of the Eq. (44) or when the output of the Eq. (44) is raise to third power and then divided by $|V_2|$ of the Eq. (43).

On the other hand, when the Eq. (45) is used, $|V_1|$ of the Eq. (42) may be multiplied by the square of the output of the Eq. (45), or $|V_2|$ of the Eq. (43) may be multiplied by the third power of the output of the Eq. (45). As a result, the output of the Eq. (46) representative of an accurate surface potential is achieved.

The specific circuitry described with reference to FIG. 5 is also applicable to this embodiment as the device for correcting the fluctuation of the output of the potential signal on the basis of a plurality of output signals of different frequencies and thereby producing an accurate output signal. The specific circuitry shown in any one of FIGS. 16–20 is used to perform, with the values $|V_1|$ and $|V_2|$, the computation not dependent on the distance L and thereby output an accurate surface potential.

In this embodiment, the means for causing the sense electrode 2 to vibrate at different frequencies or to change the electrostatic capacity may also be implemented by any one of the specific configurations shown in FIGS. 11A–11D.

Again, among the vibrating means shown in FIGS. 11A–11D, the vibrating means using the voice coil 23 is preferable because it causes the electrode to vibrate greatly with a simple and inexpensive structure. This insures a sufficient S/N ratio and implements an accurate, efficient and simple arrangement. The voice coil may be arranged in any one of the specific configurations shown in 14A–14F.

In the illustrative embodiment, only the first and second order frequency components suffice to produce an accurate surface potential with high efficiency, as stated above. When higher accuracy of measurement is desired, the third and successive order frequency components may be used in addition to the first and second order components. Further, to enhance reliability, two or more sense electrodes may be used, in which case the above method and means for measurement will be assigned to each of them.

4th Embodiment

Figure 24:
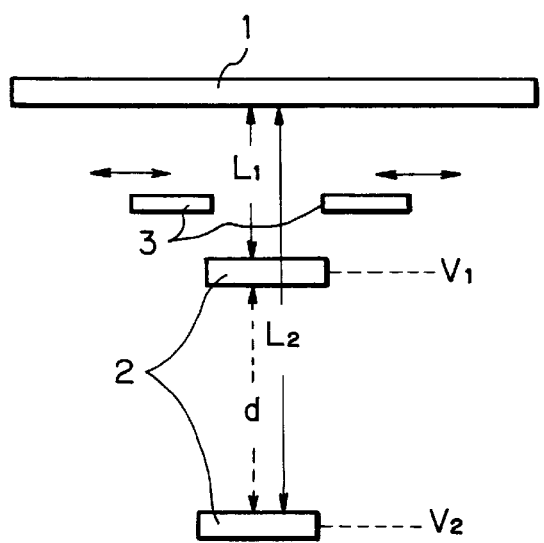
FIG. 24 shows a fourth embodiment of the present invention.

This embodiment detects a plurality of output signals each having a particular value from a single sense electrode 2 and corrects the fluctuation of the potential signal by use of the chopper electrode 3. As shown in FIG. 24, the sense electrode 2 is displaced in order to vary the distance between it and the object 1, so that an output signal is produced at each position of the electrode 2. The principle of measurement described with reference to FIG. 1A is also applicable to this embodiment. The chopper electrode 3 may be displaced either periodically or nonperiodically, as desired.

The periodic displacement may occur with, e.g., the previously stated sinusoidal waveform or a rectangular, trapezoidal, triangular, saw-tooth or pulse waveform.

Figure 28:
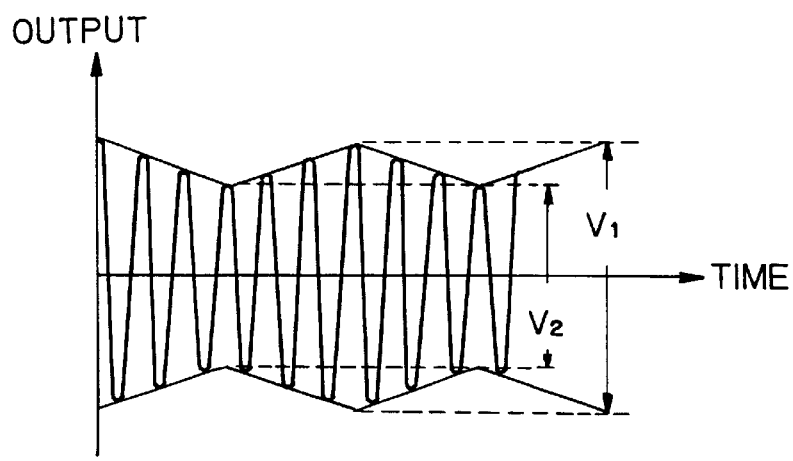
Figure 29:
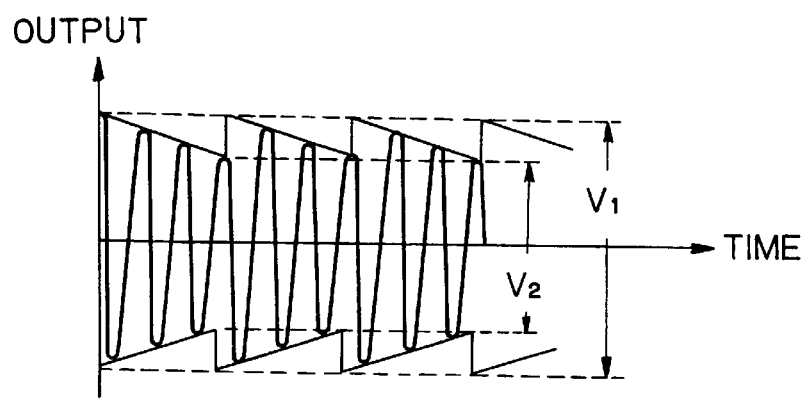
Figure 30:
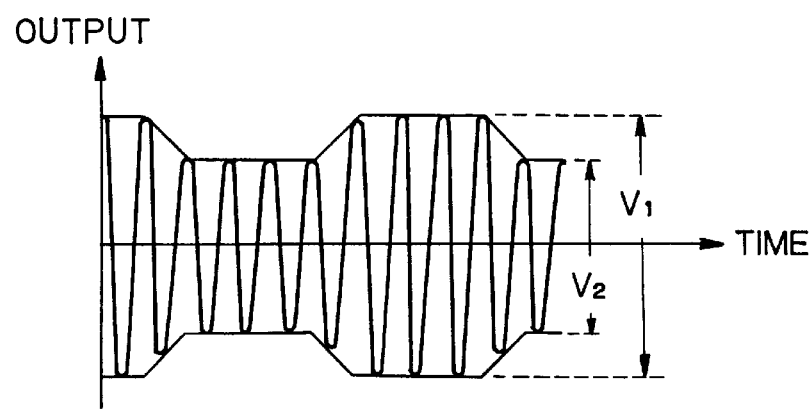

As shown in FIG. 24, assume that the sense electrode 2 outputs a signal $V_1$ when spaced a distance $L_1$ from the object 1 and outputs a signal $V_2$ when spaced a distance $L_1$ from the same. Then, the signals $V_1$ and $V_2$ each has a particular waveform shown in FIG. 25 because the sensor output depends on the above distance. When the sense electrode 2 is displaced between the positions $L_1$ and $L_2$ periodically or nonperiodically, the sensor output has, e.g., a sinusoidal waveform (FIG. 26), a rectangular waveform (FIG. 27), a triangular waveform (FIG. 28), a saw-tooth waveform (FIG. 29), or a trapezoidal waveform (FIG. 30).

Next, the distance $L_1$ is determined unconditionally from the output signals $V_1$ and $V_2$ without depending on the surface potential $V_S$. First, as for the chopper type device, the ratio of change $\alpha_0$ of the electrostatic capacitance $C_0$ is expressed as:

$$\alpha_0 = \Delta S / S \qquad \text{Eq. (48)}$$

where $\Delta S$ is the variation of the effective area of the sense electrode 2. Assume that the electrostatic capacitance is $C_1$ when the distance between the object 1 and the sense electrode 2 is $L_1$ or $C_2$ when the distance is L2. Then, the output signals $V_1$ and $V_2$ may be expressed, based on the Eqs. (1), (5) and (48), as:

$$\begin{aligned} V_1 &= A_0 \cdot \alpha_0 \cdot \omega \cdot C_1 \cdot V_S \cdot \cos \omega t \\ &= A_0 \cdot \omega \cdot \varepsilon_{air} \cdot (\Delta S / L_1) \cdot V_S \cdot \cos \omega t \end{aligned} \qquad \text{Eq. (49)}$$

$$\begin{aligned} V_2 &= A_0 \cdot \alpha_0 \cdot \omega \cdot C_2 \cdot V_S \cdot \cos \omega t \\ &= A_0 \cdot \omega \cdot \varepsilon_{air} \cdot (\Delta S / L_2) \cdot V_S \cdot \cos \omega t \end{aligned} \qquad \text{Eq. (50)}$$

Because $L_1 = L_1 + d$, it is possible to determine the distance $L_1$ based on the Eqs. (49) and (50). To determine the distance $L_1$ unconditionally, the ratio between $V_1$ and $V_2$ is produced. For example, a ratio $V_2/V_1$ is given by:

$$VV_2/V_1 = L_1/L_2 = L_1/(L_1+d) = F(L_1) \qquad \text{Eq. (51)}$$

In this manner, the ratio $V_2/V_1$ is represented by a linear function $(FL_1)$ with respect to $L_1$.

Figure 31A:
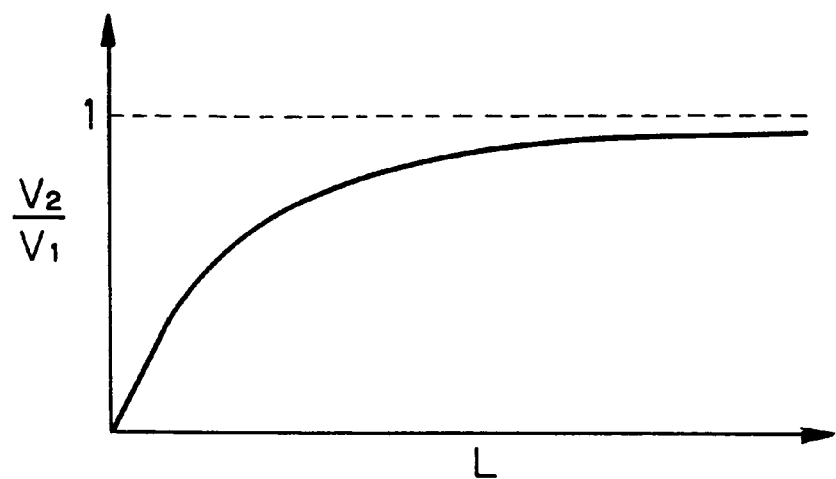
FIGS. 31A and 31B each shows a specific relation between the distance between the object and the sense electrode and the ratio between signals of different values and occurring when the distance between the object and the sense electrode varies.

FIG. 31A shows a curve representative of a relation between the distance $L_1$ and the ratio $V_2/V_1$. In this manner, if the ratio $V_2/V_1$ is determined, the distance $L_1$ can be determined unconditionally without depending on the surface potential $V_S$.

Alternatively, if a ratio $V_1/V_2$ is used, then it is expressed as:

$$V_1/V_2 = L_2/L_1 = (L_1+d)/L_1 = F(L_1) \qquad \text{Eq. (52)}$$

Figure 31B:
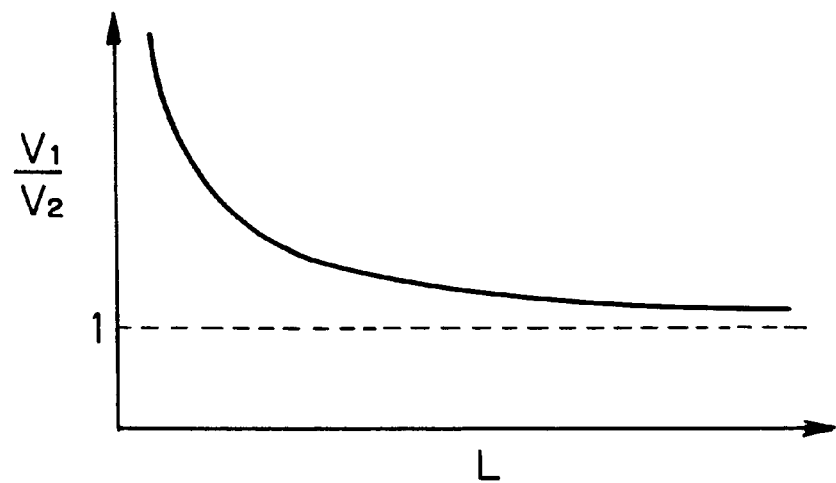

This ratio can also be represented by a linear function $F(L_1)$ with respect to the distance $L_1$. FIG. 31B shows a curve representative of a relation between the distance L1 and the ratio $V_1/V_2$. Again, if the ratio $V_1/V_2$ is determined, the distance $L_1$ can be unconditionally determined without depending on the surface potential VS.

The output $V_1$ or $V_2$ is corrected on the basis of the distance $L_1$ determined unconditionally and the known relation between $V_1$ or $V_2$ and $L_1$. Further, a surface potential $V_S$ corresponding to the corrected $V_2$ or $V_1$ is determined on the basis of the known relation between the surface potential VS and the value $V_1$ or $V_2$. As a result, the accurate surface potential of the object 1 is produced. Alternatively, the determined distance $L_1$ may be substituted for the Eq. (49) or (50) so as to determine the surface potential unconditionally.

Figure 32:
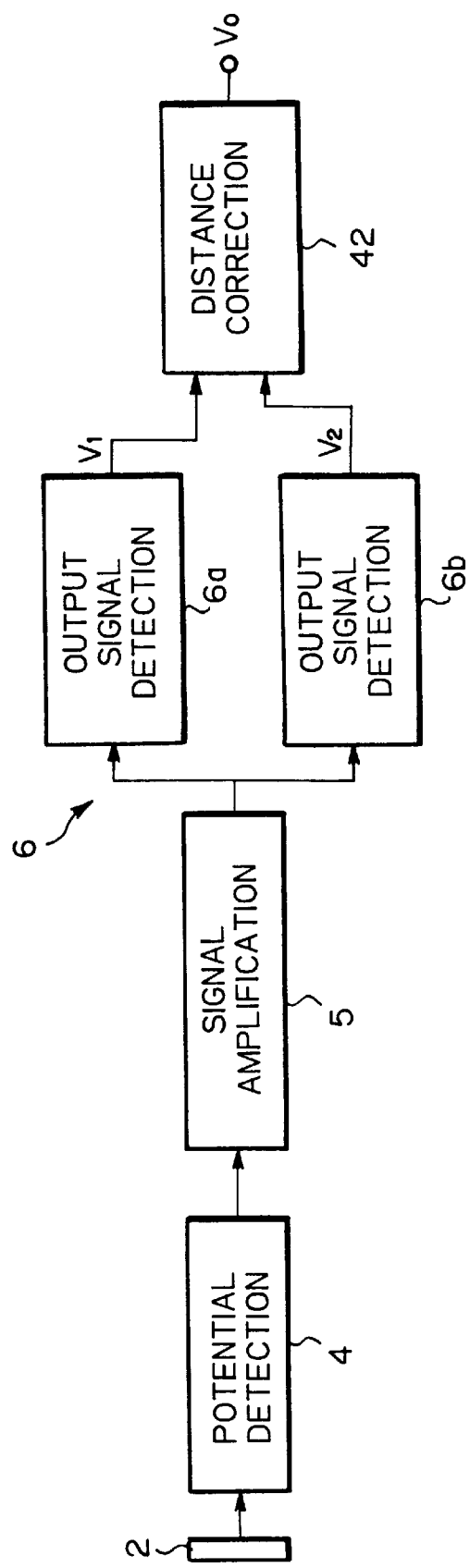
FIG. 32 is a block diagram schematically showing a specific configuration of the fourth embodiment.

FIG. 32 shows specific circuitry for correcting the distance and thereby producing an accurate output signal representative of the surface potential of the object 1, as stated above. As shown, the circuitry has a signal amplification 5 and a distance correction 42 in addition to the potential signal detection 4 and output detecting means 6, i.e., at least two signal detections 6a and 6b. The distance correction 42 also plays the role of the surface potential outputting means. Of course, three or more output signals may be detected out of a single sense electrode 2 in order to enhance accurate measurement. In addition, to enhance reliability, two or more sense electrodes may be used. This embodiment is also practicable with any one of the electrode vibrating means shown in FIGS 11A–11D, 12A, 12B, 13A–13F, and 14A–14F.

5th Embodiment

Figure 33:
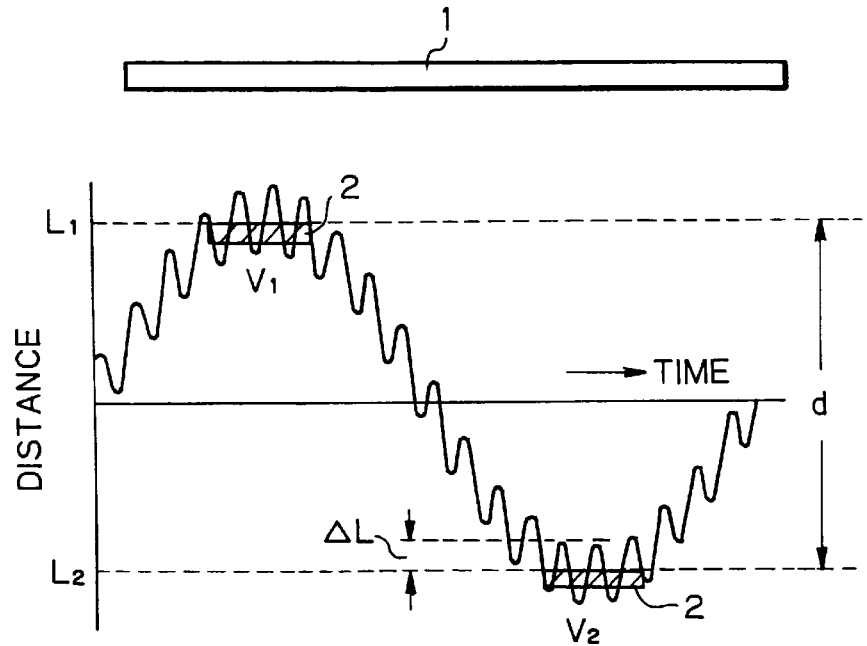
FIG. 33 shows a fifth embodiment of the present invention.

This embodiment also detects a plurality of output signals each having a particular value from a single sense electrode 2 and corrects the fluctuation of the potential signal by use of the chopper electrode 3. Briefly, this embodiment pertains to the vibrating-reed type device using only a vibration electrode. As shown in FIG. 33, the sense electrode is displaces periodically toward and away from the object 1, so that an output signal is produced at each position of the electrode 2. The principle of measurement described with reference to FIG. 1B is also applicable to this embodiment. The sense electrode 2 may be displaced with either the sinusoidal waveform shown in FIG. 33 or a rectangular, trapezoidal, triangular, saw-tooth wave or pulse waveform.

As shown in FIG. 33, assume that the sense electrode 2 outputs a signal $V_1$ when spaced a distance $L_1$ from the object 1 and outputs a signal $V_2$ when spaced a distance $L_2$ which is spaced a distance d from $L_1$. Then, the signals $V_1$ and $V_2$ each has a particular waveform shown in FIG. 25 because the sensor output depends on the above distance. When the sense electrode 2 is displaced between the positions $L_1$ and $L_2$ (distance d) periodically or nonperiodically, the sensor output has, e.g., a sinusoidal waveform (FIG. 26), a rectangular waveform (FIG. 27), a regular waveform (FIG. 28), a saw-tooth waveform (FIG. 29), or a trapezoidal waveform (FIG. 30).

Next, the distance $L_1$ is determined unconditionally from the output signals $V_1$ and $V_2$ without depending on the surface potential $V_S$. First, as for the vibrating-reed type device, the ratio of change $\alpha_0$ of the electrostatic capacitance $C_0$ is expressed with respect to the distances $L_1$ and $L_2$ as:

$$\alpha_1 = \Delta L/(L_1 - \Delta L) \quad \text{Eq. (53)}$$

$$\alpha_2 = \Delta L/(L_2 - \Delta L) \quad \text{Eq. (54)}$$

where $\Delta L$ is the width of fluctuation of the sense electrode 2. Assume that the electrostatic capacity is $C_1$ when the distance between the object 1 and the sense electrode 2 is $L_1$ or $C_2$ when the distance is $L_2$. The, the output signals $V_1$ and $V_2$ may be expressed, based on the Eqs. (1), (5), (53) and (54), as:

$$V_1 = A_0 \cdot \alpha 1 \cdot \omega \cdot C_1 \cdot V_S \cdot \cos\omega t = A_0 \cdot (\Delta L/(L1 - \Delta L)) \cdot \omega \cdot \epsilon_{air} \cdot (S/L_1) \cdot V_S \cdot \cos\omega t \quad \text{Eq. (55)}$$

$$V_2 = A_0 \cdot \alpha_2 \cdot \omega \cdot C_2 \cdot V_S \cdot \cos\omega t = A_0 \cdot (\Delta L/(L_2 - \Delta L)) \cdot \omega \cdot \epsilon_{air} \cdot (S/L_2) \cdot V_S \cdot \cos\omega t \quad \text{Eq. (56)}$$

Because $L_2 = L_1 + d$, it is possible to determine the distance $L_1$ based on the Eqs. (55) and (56). To determine the distance $L_1$ unconditionally, the ratio between $V_1$ and $V_2$ is produced by use of the Eqs. (55) and (56). For example, a ratio $V_2/V_1$ is given by:

$$V_2/V_1 = L_1 \cdot (L_1 - \Delta L)/[L_2 \cdot (L_2 - \Delta L)] = L_1 \cdot (L_1 - \Delta L)/[(L_1 + d) \cdot (L_1 + d - \Delta L)] = F(L_1^2) \quad \text{Eq. (57)}$$

The ratio $V_2/V_1$ can therefore be represented by a quadratic function $F(L_1^2)$ with respect to L1.

FIG. 31A shows a curve representative of a relation between the distance $L_1$ and the ratio $V_2/V_1$. In this manner, if the ratio $V_2/V_1$ is determined, the distance $L_1$ can be determined unconditionally without depending on the surface potential $V_S$.

Alternatively, if a ratio $V_1/V_2$ is used, then it is expressed as:

$$V_1/V_2 = L_2 \cdot (L_2 - \Delta L)/[L_1 \cdot (L_1 - \Delta L)] = (L_1 + d) \cdot (L_1 + d - \Delta L)/[(L_1 \cdot (L_1 - \Delta L)] = F(L_1^2) \quad \text{Eq. (58)}$$

This ratio can also be represented by the quadratic function $F(L_1^2)$ with respect to the distance $L_1$. FIG. 31B shows a curve representative of a relation between the distance $L_1$ and the ratio $V_1/V_2$. Again, if the ratio $V_1/V_2$ is determined, the distance $L_1$ can be determined unconditionally without depending on the surface potential $V_S$.

The output $V_1$ or $V_2$ is corrected on the basis of the distance $L_1$ determined unconditionally and the known relation between $V_1$ or $V_2$ and $L_1$. Further, a surface potential $V_S$ corresponding to the corrected $V_1$ or $V_2$ is determined on the basis of the known relation between the surface potential $V_S$ and the value $V_1$ or $V_2$. As a result, the accurate surface potential of the object 1 is produced. Alternatively, the determined distance $L_1$ may be substituted for the Eq. (55) or (56) so as to determine the surface potential unconditionally. This embodiment Is also practicable with the specific circuitry shown in FIG. 32.

Figure 21A:
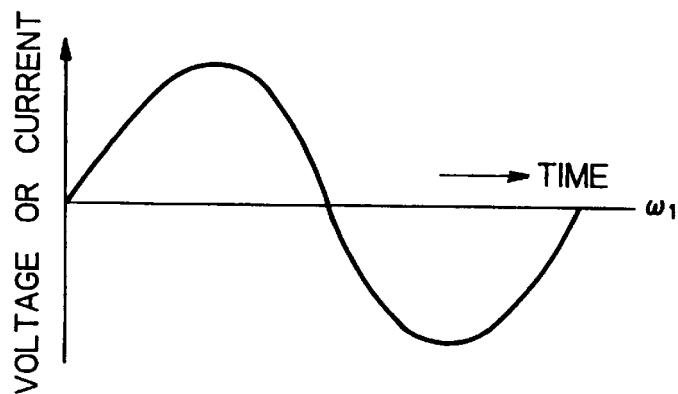
FIGS. 21A–21C show the waveforms of drive voltages or currents applicable to single electrode vibrating means or a plurality of electrode vibrating means.
Figure 21B:
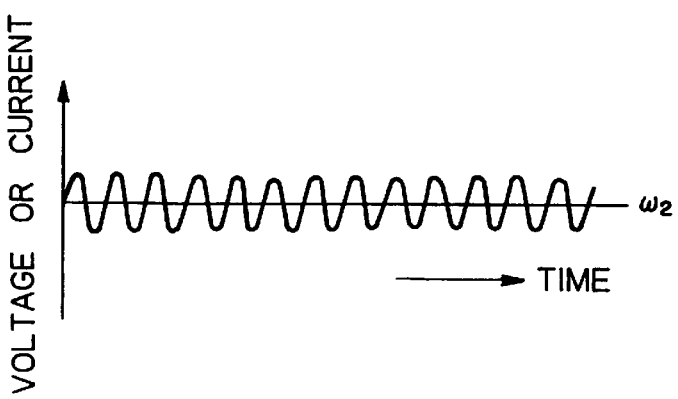
Figure 21C:
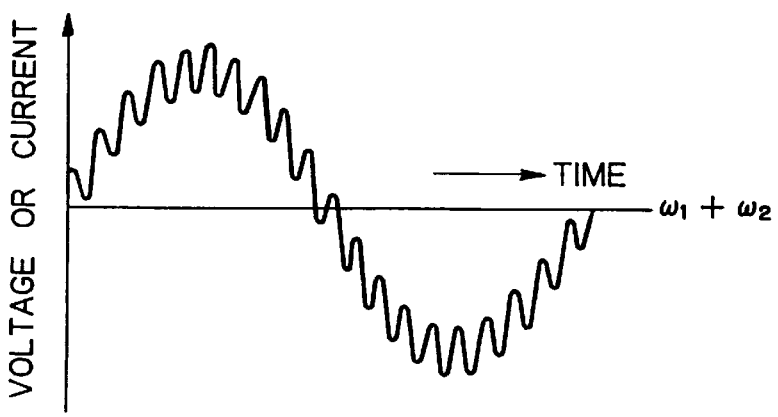
Figure 22A:
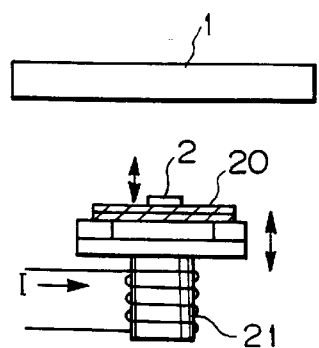
FIGS. 22A–22I each shows a specific configuration of the electrode vibrating means implemented by a combination of the vibrating means shown in FIGS. 11A–11C.
Figure 22B:
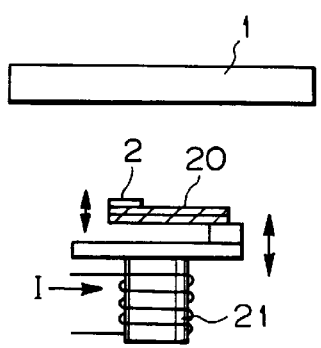
Figure 22C:
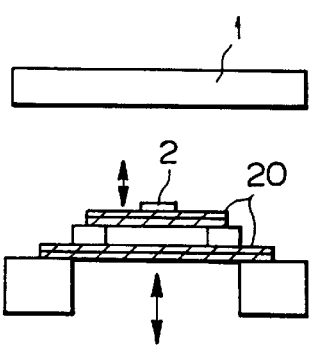
Figure 22D:
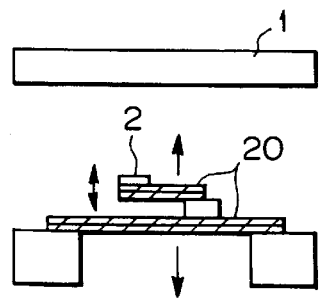
Figure 22E:
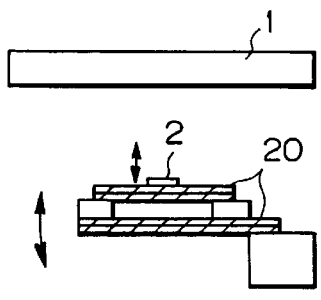
Figure 22F:
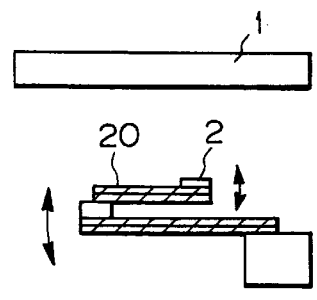
Figure 22G:
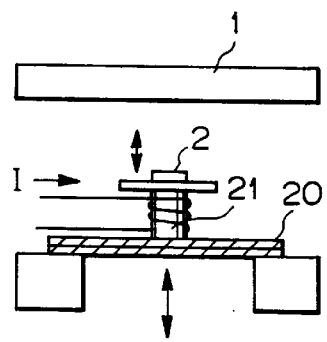
Figure 22H:
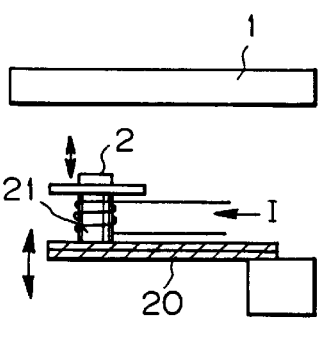
Figure 22I:
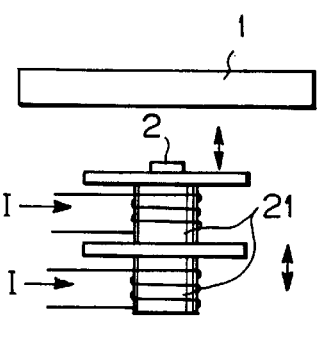

To vary the distance between the object 1 and the sense electrode 2 by moving the electrode 2 periodically, as stated above, the drive voltage or current waveform shown in FIG. 21A and the dive voltage or current waveform shown in FIG. 21B may be superposed on each other, and the resulting waveform shown in FIG. 21C way be applied to the electrode vibrating means shown in any one of FIGS. 11A–11D. There may be used not only the sinusoidal waveforms shown in FIGS. 21A–21C but also the waveforms (rectangular, trapezoidal, triangular, saw-tooth and other periodic waveforms or waveforms varying nonperiodically) for vibrating the sense electrode 2, and the waveforms (sinusoidal (FIG. 26), rectangular (FIG. 27), triangular (FIG. 28), saw-tooth (FIG. 29), trapezoidal (FIG. 30) and other periodic waveforms or waveforms varying nonperiodically) for displacing the electrode 2. Alternatively, the drive voltages or currents shown in FIGS. 21A and 21B may be respectively applied to any two of the vibrating means shown in FIGS. 11A–11D, so that the waveform of FIG. 33 appears at the sense electrode 2. In this case, the piezoelectric materials shown in FIGS. 22A–22I may be replaced with a tuning fork or a vibration piece to which the flat piezoelectric material is adhered.

6th Embodiment

Figure 34:
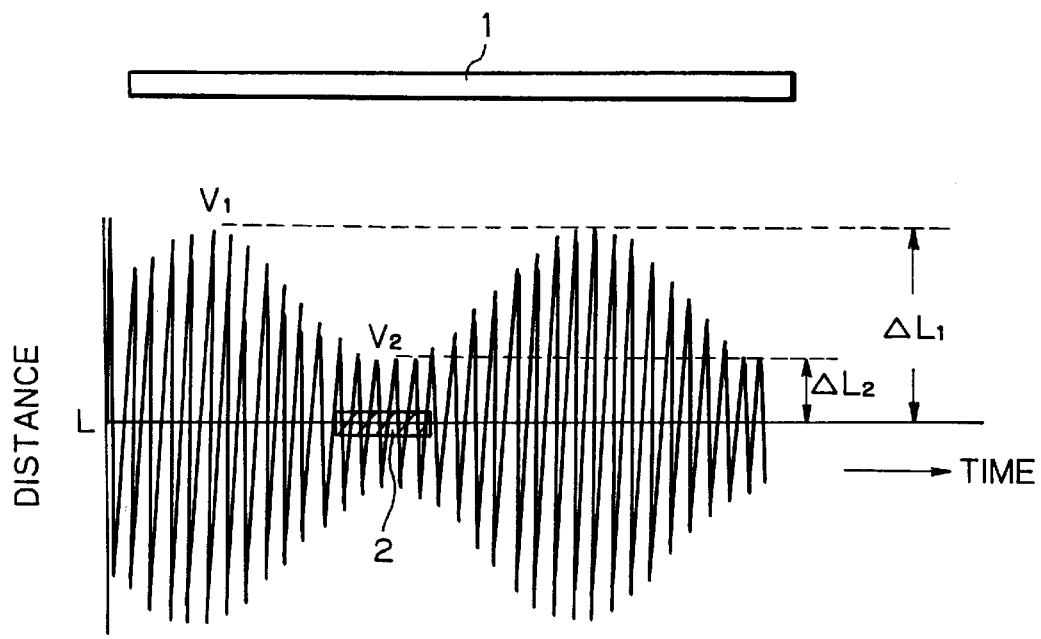
FIG. 34 shows a sixth embodiment of the present invention.

This embodiment detects a plurality of output signals each having a particular value from a single sense electrode 2 and has the vibrating-reed type configuration using only the sense electrode 2 for the correction of the fluctuation of the potential signal. Briefly, to detect two or more output signals, the sense electrode 2 is moved toward and away from the object 1 periodically. At this instant, the displacement of the sense electrode 2 is varied, so that an output signal is produced at each position of the electrode 2. The principle of measurement shown in FIG. 1A is also applicable to this embodiment. The sense electrode 2 may be displaced with either a sinusoidal waveform shown in FIG. 34 or a rectangular, trapezoidal, triangular, saw-tooth or pulse waveform. As shown in FIG. 34, assume that the sense electrode is located at a distance L from the object 1, and that it outputs a signal $V_1$ when moved a distance $\Delta L_1$ toward the object 1 away from the position L and outputs a signal $V_2$ when moved a distance $\Delta L_2$. Then, because the output signal is substantially proportional to the displacement of the sense electrode 2, the signals $V_1$ and $V_2$ each has a particular value shown in FIG. 25. By varying the displacement of the sense electrode 2 either periodically or nonperiodically, it is possible to produce different output values varying with the sinusoidal waveform (FIG. 26), rectangular waveform (FIG. 27), triangular waveform (FIG. 28), saw-tooth waveform (FIG. 29) or trapzoidal waveform (FIG. 30) by way of example.

Next, the distance $L_1$ is determined unconditionally from the output signals $V_1$ and $V_2$ without depending on the surface potential $V_S$. First, as for the vibrating-reed type device, the ratio of change $\alpha_0$ of the electrostatic capacitance $C_0$ is expressed with respect to the displacements $\Delta L_1$ and $\Delta L_2$ as:

$$\beta_1 = \Delta L_1/(L_1 - \Delta L_1) \qquad \text{Eq. (59)}$$

$$\beta_2 = \Delta L_2/(L - \Delta L_2) \qquad \text{Eq. (60)}$$

Therefore, the output signals $V_1$ and $V_2$ may be expressed, based on the Eq. (1), (5), (59) and (60), as:

$$V_1 = A_0 \cdot \beta_1 \cdot \omega \cdot C_0 \cdot V_S \cdot \cos\omega t = A_0 \cdot (\Delta L_1/(L - \Delta L_1)) \cdot \omega \cdot \epsilon_{air} \cdot (S/L) \cdot V_S \cdot \cos\omega t \qquad \text{Eq. (61)}$$

$$V_2 = A_0 \cdot \beta_2 \cdot \omega \cdot C_0 \cdot V_S \cdot \cos\omega t = A_0 \cdot (\Delta L_1/(L - \Delta L_2)) \cdot \omega \cdot \epsilon_{air} \cdot (S/L) \cdot V_S \cdot \cos\omega t \qquad \text{Eq. (62)}$$

To determine the distance $L_1$ unconditionally, the ratio between $V_1$ and $V_2$ is produced by use of the Eqs. (61) and (62). For example, a ratio $V_2/V_1$ is given by:

$$V_2/V_1 = \Delta L_2 \cdot (L - \Delta L_1)/[\Delta L_1 \cdot (L - \Delta L_2)] = F(L) \qquad \text{Eq. (63)}$$

The ratio $V_2/V_1$ can therefore be represented by a linear function $F(L)$ with respect to L.

Figure 35A:
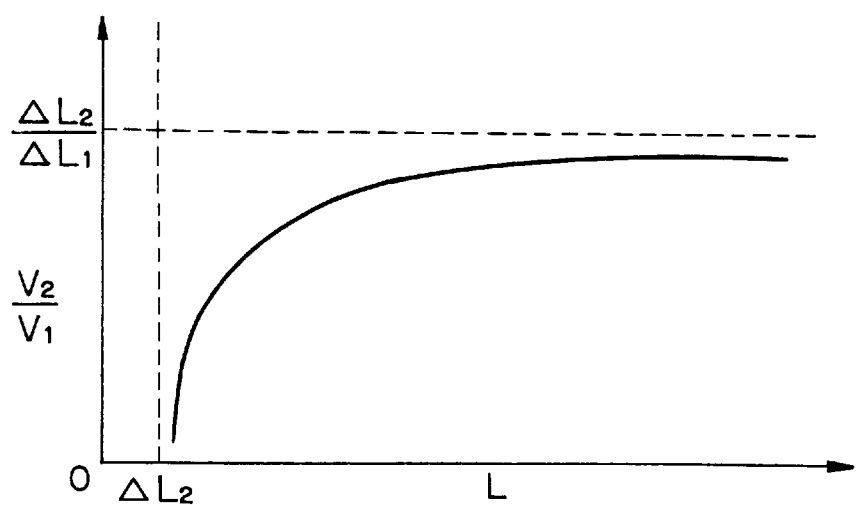
FIGS. 35A and 35B each shows a specific relation between the distance between the object and the sense electrode and the ratio between signals of different values and occurring when the distance between the object and the sense electrode vary and vary over different widths.

FIG. 35A shows a curve representative of a relation between the distance L and the ratio $V_2/V_1$. In this manner, if the ratio $V_2/V_1$ is determined, the distance $L_1$ can be determined unconditionally without depending on the surface potential $V_S$.

Alternatively, if a ratio $V_1/V_2$ is used, then it is expressed as:

$$V_1/V_2 = \Delta L_1 \cdot (L - \Delta L)/[\Delta L_2 \cdot (L - \Delta L_1)] = F(L) \qquad \text{Eq. (64)}$$

Figure 35B:
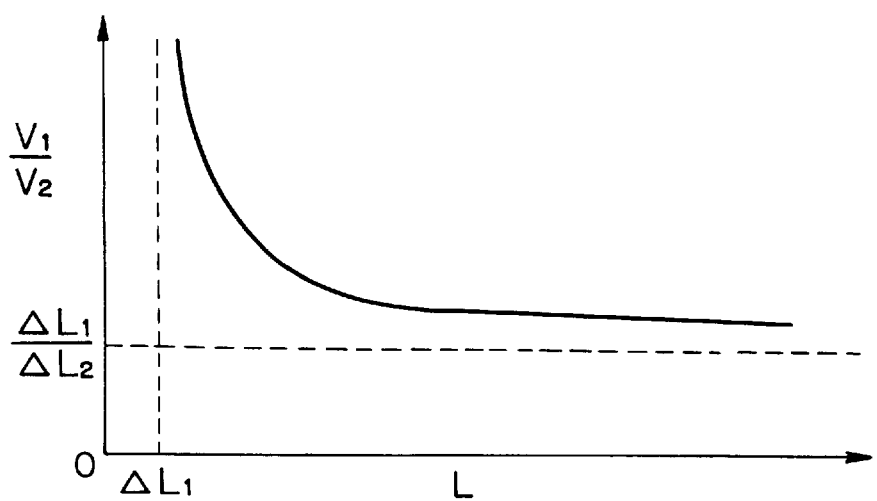

This ratio can also be represented by the linear function $F(L)$ with respect to the distance L. FIG. 35B shows a curve representative of a relation between the distance L and the ratio $V_1/V_2$. Again, if the ratio $V_1/V_2$ is determined, the distance L can be determined unconditionally without depending on the surface potential $V_S$.

The output $V_1$ or $V_2$ is corrected on the basis of the distance L determined unconditionally and the known relation between $V_1$ or $V_2$ and L. Further, a surface potential $V_S$ corresponding to the corrected $V_1$ or $V_2$ is determined on the basis of the known relation between the surface potential $V_S$ and the value $V_1$ or $V_2$. As a result, the accurate surface potential of the object 1 is produced. Alternatively, the determined distance $L_1$ may be substituted for the Eq. (61) or (62) so as to determine the surface potential unconditionally.

This embodiment is also practicable with the specific circuit shown in FIG. 32.

Figure 36A:
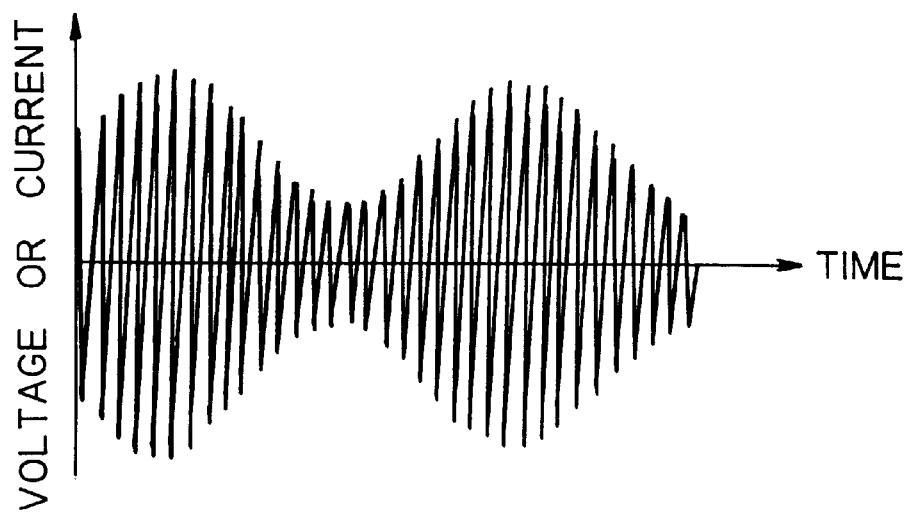
FIGS. 36A and 36B each shows a specific waveform of a drive voltage or current applied to a drive source for driving the electrode vibrating means such that the sense electrode moves toward and away from the object periodically over different widths.
Figure 36B:
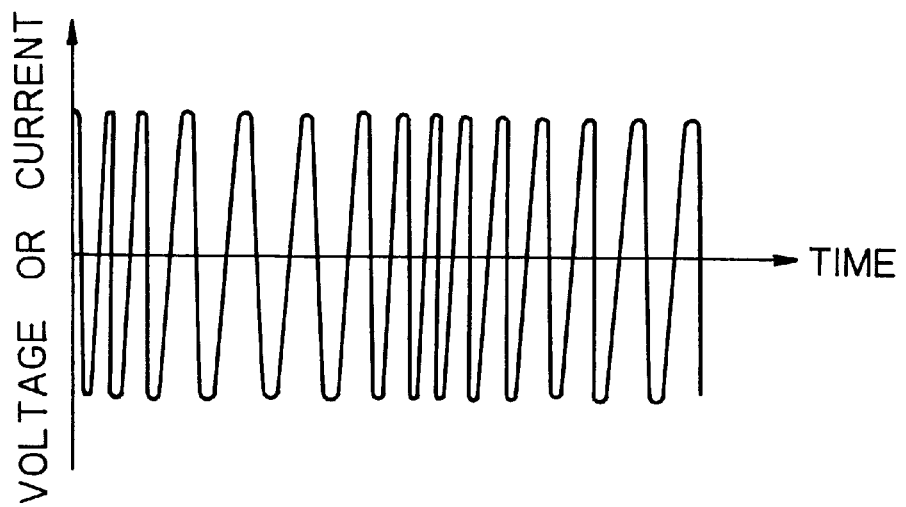

To vary the displacement of the sense electrode toward the object 1 periodically, as stated above, a drive voltage or current whose size varies as shown in FIG. 36A may be applied to any one of the electrode vibrating means shown in FIGS. 11A–11D. Alternatively, a drive voltage or current having a constant size, but varying in frequency, as shown in FIG. 36B may be applied to the electrode vibrating means. Further, a drive voltage or current varying both in size and in frequency may be applied, if desired. There may be used not only the sinusoidal waveforms shown in FIGS. 36A and 36B but also the waveforms (rectangular, trapezoidal, triangular, saw-tooth and other periodic waveforms or waveforms varying nonperiodically) for vibrating the sense electrode 2, and the waveforms (sinusoidal (FIG. 26), rectangular (FIG. 27), triangular (FIG. 28), saw-tooth (FIG. 29), trapezoidal (FIG. 30) and other periodic waveforms or waveforms varying nonperiodically) for displacing the electrode 2.

7th Embodiment

Figure 38A:
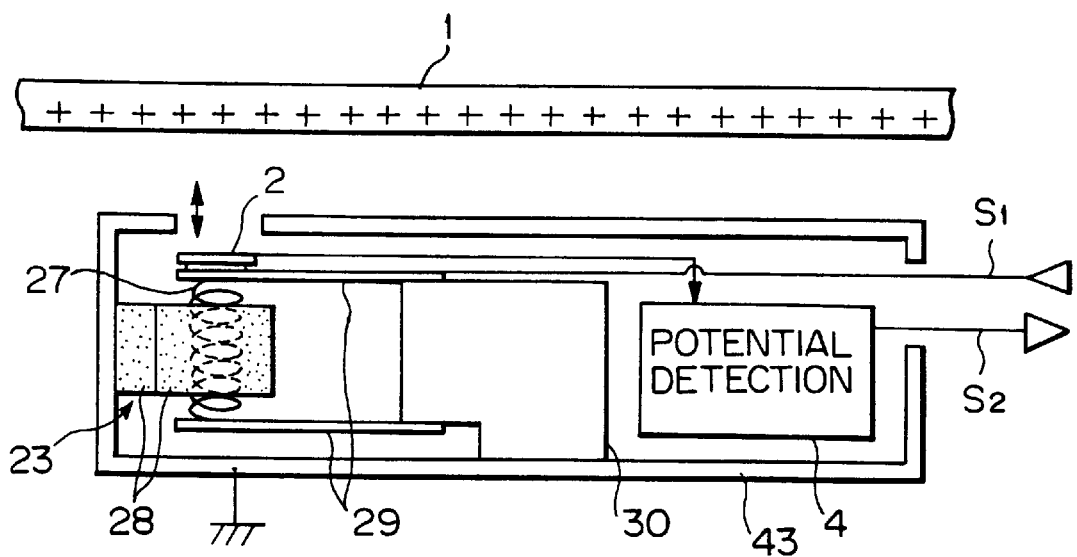
Figure 38B:
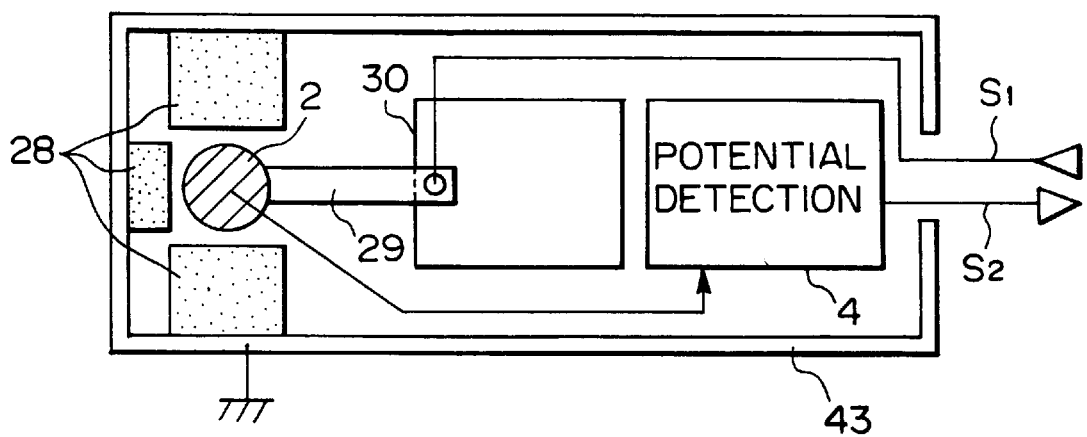
Figure 39A:
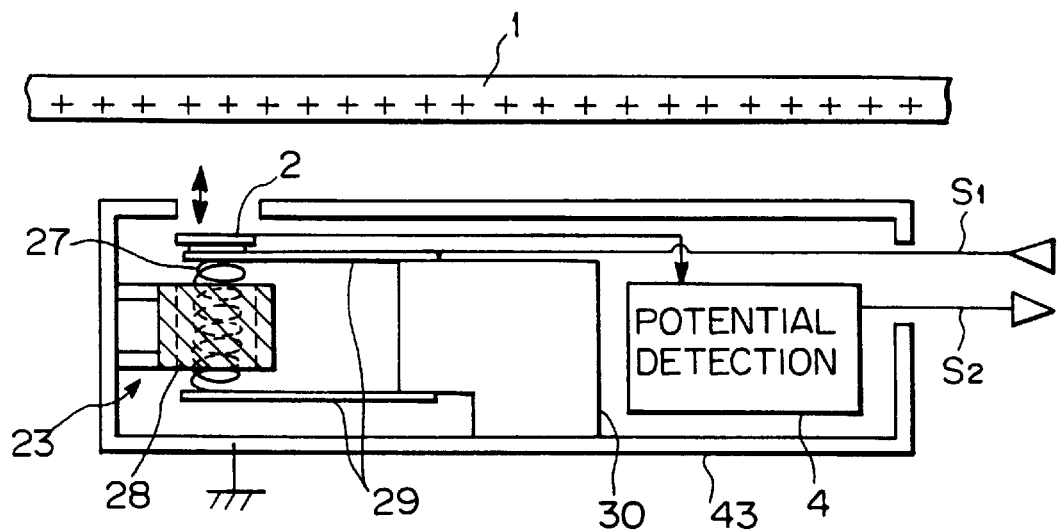
Figure 39B:
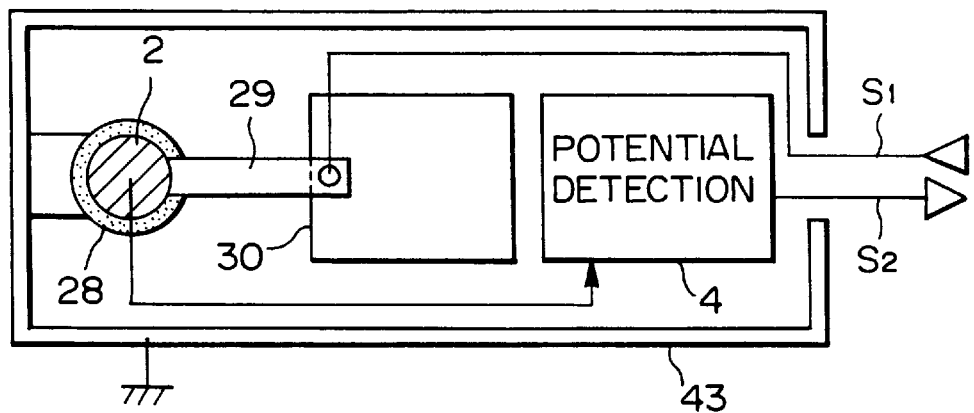

This embodiment pertains to the chopper type device using the voice coil to vary the electrostatic capacitance between the sense electrode 2 and the object 1. FIGS, 37, 38 and 38B and 39A and 39B each shows a specific configuration of a probe section included in the device. In FIG. 37, the electromagnetic coil 24 has the coil bobbin 26 playing the role of the coil portion of the voice coil 23. In FIGS. 38A and 38B, the coil bobbin 26 is absent, and rectangular permanent coils 28 are arranged around the solenoid coil 27. In FIGS. 39A and 39B, the coil bobbin 26 is absent, and a flat or cylindrical permanent magnet 28 is positioned around the solenoid coil 27. While the sense electrode 2 is located at a preselected distance from the object 1, the capacitance between the electrode 2 and the object 1 is varied by the voice coil 23. The electromagnetic coil 24 of the voice coil 23 or the solenoid coil 27 is mounted on the free ends of two leaf springs 29 the other ends of which are affixed to the base 30. The sense electrode 2 is associated with the coil 24 or 27 and caused to vibrate via the coil 24 or 27.

The variation of the potential induced on the sense electrode 2 due to the vibration is detected by the potential signal detection 4. The voice coil 23 with the sense electrode 2 and the potential signal detection 4 are accommodated in an electrically shielded casing (shield case) having an opening. The sense electrode 2 is exposed to the object 1 via the opening of the shield case 34.

Figure 40A:
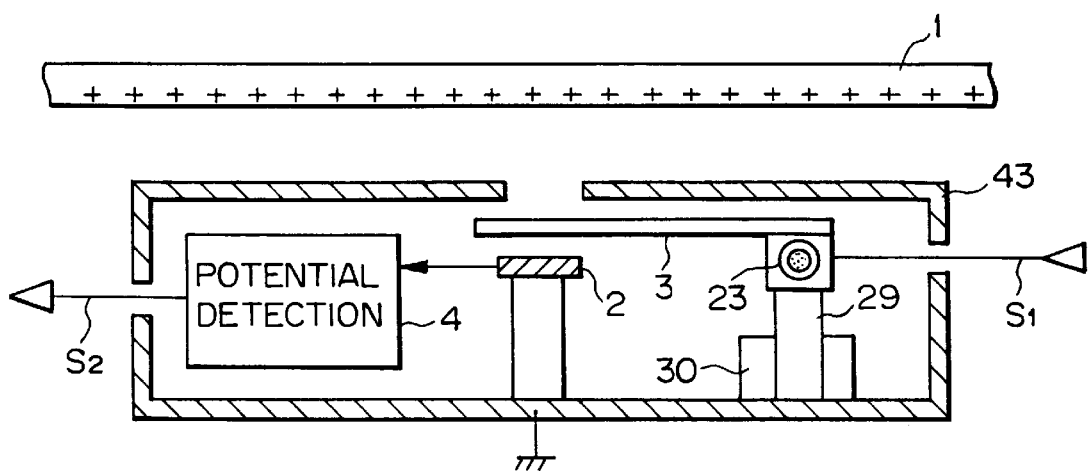
Figure 40B:
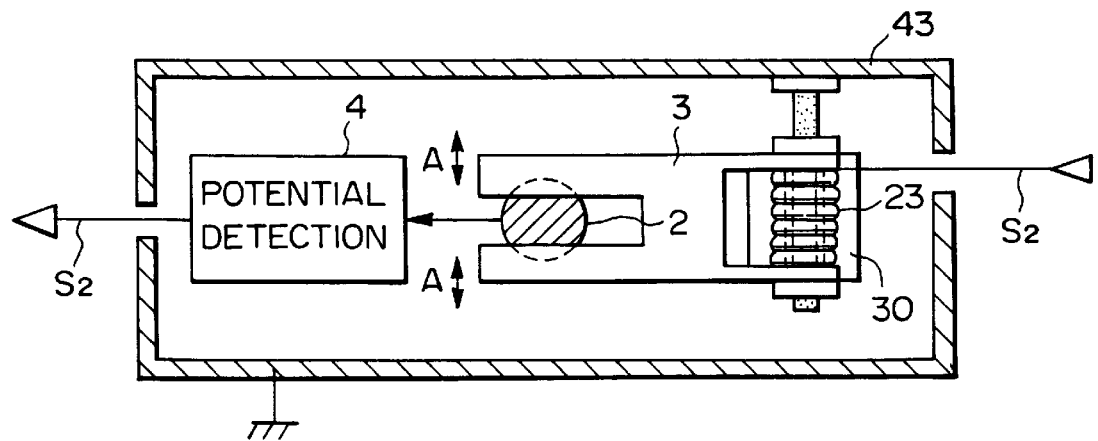
Figure 41A:
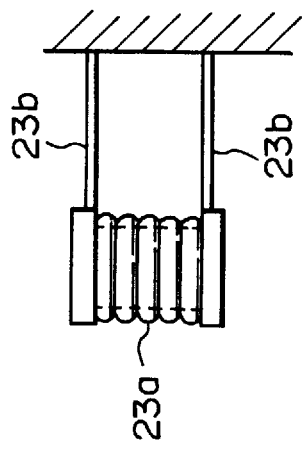
FIGS. 41A–41E show specific configurations of a voice coil shown in FIGS. 40A and 40B.
Figure 41B:
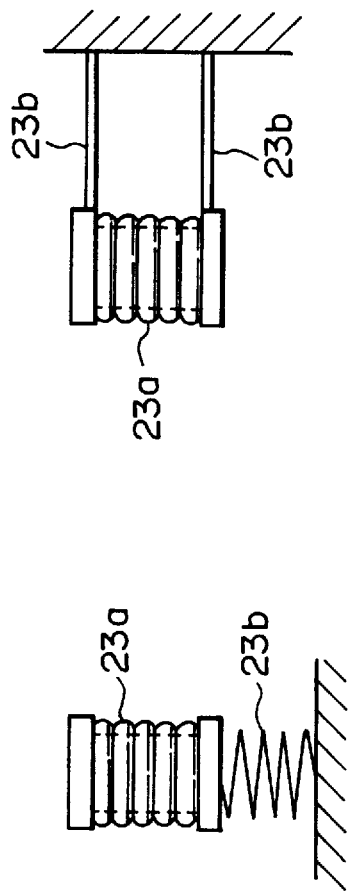
Figure 41C:
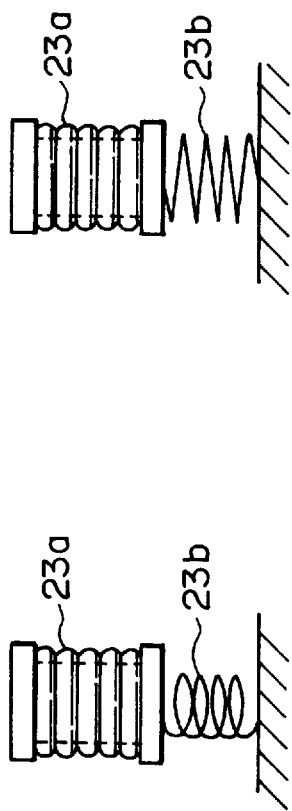
Figure 41D:
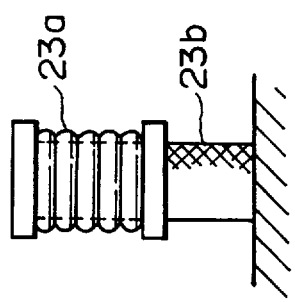
Figure 41E:
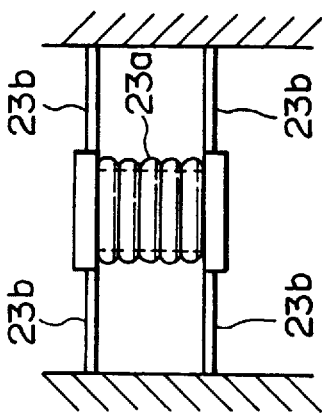

FIGS. 40A and 40B show another specific probe configuration in which the voice coil 23 is mounted on the chopper electrode 3 and caused to vibrate for measurement As shown in any one of FIGS. 41A–41E, the voice coil 23 is made up of an electromagnetic coil 23a and at least one resilient or elastic member 23b. The member 23b may be formed of metal, rubber, resin or similar resilient or elastic material. In FIG. 41A, the member 23b is implemented as a coil spring. In FIG. 41B, the member 23b is implemented as a wave- or wedge-like spring. In FIG. 41C, two leaf springs 23b in the form of beams are used. FIGS. 41D and 41E each shows the member or members 23 formed of rubber or resin. The beam-like configuration of FIG. 41C is advantageous over the others because it is most inexpensive and simplest.

Assume that the beam-like leaf springs shown in FIG. 41C arc used. In the case of the chopper type device, the ratio of change $\alpha_0$ of the electrostatic capacity is expressed as:

$$\alpha_0 = \Delta S/S \qquad \text{Eq. (65)}$$

where $\Delta S$ is the variation of the effective area of the sense electrode 2.

To increase the S/N ratio, i.e., the ratio of change $\alpha 0$, the variation $\Delta S$ may be increased. The voice coil 23 is an effective implementation for increasing the variation $\Delta S$. As for the chopper type device, the chopper electrode 3 is mounted on the electromagnetic coil 23a of the voice coil 23 and is caused to move via the coil 23. A tuning fork and the voice coil 23 each implementing the chopper electrode 3 compare with respect to the width over which the vibration of the chopper electrode vary, as follows. With the voice coil 23, it is possible to achieve a width more than ten times as great as the width available with the tuning fork. Therefore, a surface potential detection signal $S_z$ achievable with the voice coil 23 is more tan ten times, in size, as great as a signal available with she turning fork. This increases the S/N ratio. For a signal $S_1$ for driving the voice coil 26, use may be made of a DC voltage or current or a voltage or current varying perodically.

In any one of the configurations shown in FIGS. 37–40B, the drive signal (voltage or current) S1 is fed to the voice coil 23 from the outside of the shield case 43. As a result, the sense electrode 2 vibrates and varies the electrostatic capacitance. The variation of the capacity induces a change in potential on the sense electrode 2. The potential signal detection 4 detects the change in potential and outputs the resulting signal S2 to the outside of the shield case 43. The signal S2 is processed by any one of the output detecting means and surface potential outputting means shown in any one of FIGS. 5–10 or FIGS. 16–20 and 32.

In summary, it will be seen that the present invention provides a surface potential sensing device having a simple, miniature and inexpensive configuration and a desirable S/N ratio and capable of sensing a surface potential accurately without depending on the distance for measurement.

Various modifications will become possible for those skilled in the art after receiving the teachings of the present disclosure without departing from the scope thereof.

What is claimed is:

1. A device for sensing a surface potential of an object, comprising:

a sense electrode spaced a preselected distance from the object, electrically independent of the object;

capacitance varying means for varying an electrostatic capacitance between the object and said sense electrode, comprising a chopper electrode disposed between the object and the sense electrode, a first vibrator configured to vibrate the sense electrode at a first frequency, and a second vibrator configured to vibrate the chopper electrode at a second frequency, to induce on said sense electrode, in association with the surface potential of the object, a potential having at least two different frequency components;

potential detecting means for detecting said potential of said sense electrode induced in association with the surface potential of the object and varying along with the electrostatic capacitance;

output detecting means for detecting said at least two frequency components in the potential detected by said potential detecting means; and surface potential outputting means for determining the surface potential of said object based on the detected at least two frequency components and for outputting the determined surface potential of the object.

2. A device for sensing a surface potential of an object with a sense electrode spaced a preselected distance from the object and electrically independent of the object, said device comprising:

capacitance varying means for varying an electrostatic capacitance between the object and said sense electrode by vibrating said sense electrode at at least one vibrating frequency thereby to induce on said sense electrode, in association with the surface potential of the object, a potential having at least two different frequency components;

potential detecting means for detecting said potential of said sense electrode induced in association with the surface potential of the object and varying along with the electrostatic capacitance;

output detecting means for detecting said at least two frequency components in the potential detected by said potential detecting means; and surface potential outputting means for determining the surface potential of said object based on the detected at least two frequency components and for outputting the determined surface potential of the object.

3. A device as claimed in claim 2, wherein said capacitance varying means comprises:

an electrode intervening between the object and said sense electrode to thereby interrupt a part of an electric line of force issuing from the object to said sense electrode; and electrode vibrating means for causing each of said electrode and said sense electrode to vibrate at a respective different fundamental frequency at the same time, whereby the electrostatic capacitance varies at different fundamental frequencies and at respective second and successive order frequencies of said fundamental frequencies.

4. A device as claimed in claim 3, wherein second order and successive order frequency components existing in the output of said potential detecting means are neglected while only first order components at said fundamental frequencies are detected as output signals.

5. A device as claimed in claim 3, wherein said electrode vibrating means comprises a voice coil.

6. A device as claimed in claim 2, wherein said capacitance varying means comprises electrode vibrating means for causing said sense electrode to vibrate at a plurality of frequencies for thereby varying the electrostatic capacitance between the object and said sense electrode at said plurality of different frequencies.

7. A device as claimed in claim 6, wherein third order and successive order frequency components existing in the output of said potential detecting means are neglected while only first and second order frequency components are detected as output signals.

8. A device as claimed in claim 6, wherein said electrode vibrating means comprises a voice coil.

9. A device as claimed in claim 2, wherein ad capacitance varying means comprises electrode vibrating means for causing said sense electrode to vibrate greatly at a single frequency and thereby causing a plurality of frequency components to appear in the output of said potential detecting means.

10. A device as claimed in claim 9, wherein third and successive order frequency components existing in the output of said potential detecting means are neglected while only first and second order frequency components are detected as output signals.

11. A device as claimed in claim 9, wherein said electrode vibrating means comprises a voice coil.

12. A device for sensing a surface potential of an object with a sense electrode spaced at a preselected distance from the object and electrically independent of the object, said device comprising:

capacitance varying means for varying an electrostatic capacitance between the object and said sense electrode by vibrating said sense electrode at at least one vibrating frequency thereby to induce on said sense electrode in association with the surface potential of the object, a potential having at least two different frequency components;

detecting means for detecting at least two variables in said potential of said sense electrode induced in association with the surface potential of the object and varying along with the electrostatic capacitance; and surface potential outputting means for determining the surface potential of said object based on the detected at least two frequency components and for outputting the determined surface potential of the object;

said capacitance varying means comprising a voice coil.

13. A device as claimed in claim 12, wherein said voice coil is driven by a DC voltage or a periodically varying voltage.

14. A device a s claimed in claim 13, wherein said capacitance varying means further comprises resilient members implemented as beam-like springs.

15. A device as claimed in claim 14, wherein said beam-like springs are each supported at least one end thereof.

16. A device as claimed in claim 12, wherein said capacitance varying means further comprises a permanent magnet and a solenoid coil.

17. A device as claimed in claim 16, wherein said solenoid coil has a hollow tubular configuration and vibrates.

18. A device as claimed in claim 17, wherein said permanent magnet is positioned outside of said solenoid coil.

19. A device as claimed in claim 12, wherein said capacitance varying means further comprises a resilient body included in said voice coil and a solenoid coil to which a current is fed via said resilient body.

20. A device for sensing a surface potential of an object with a sense electrode spaced a preselected distance from the object and electrically independent of the object, said device comprising:

capacitance varying means for varying an electrostatic capacitance between the object and said sense electrode by vibrating said sense electrode thereby to induce on said sense electrode, in association with the surface potential of the object, a potential corresponding to the distance between said sense electrode and said object and having at least two frequency components;

potential detecting means for detecting said potential of said sense electrode induced in association with the surface potential of the object and varying along with the electrostatic capacitance;

output detecting means for detecting first and second potential values based on the at least two frequency components in the potential detected by said potential detecting means; and surface potential outputting means for determining the surface potential of said object based on a ratio of the detected first and second potential values and outputting the surface potential of the object;

said capacitance varying means comprising a voice coil.

21. A device as claimed in claim 20, wherein said voice coil is driven by a DC voltage or a periodically varying voltage.

22. A device as claimed in claim 21, wherein said capacitance varying means further comprises resilient members implemented as beam-like springs.

23. A device as claimed in claim 22, wherein said beam-like springs are each supported at least one end thereof.

24. A device as claimed in claim 20, wherein said capacitance varying means further comprises a permanent magnet and a solenoid coil.

25. A device as claimed in claim 24, wherein said permanent magnet is positioned outside of said solenoid coil.

26. A device as claimed in claim 20, wherein said capacitance varying means further comprises a resilient body included in said voice coil and a solenoid coil to which a current is fed via said resilient body.

27. A device as claimed in claim 20, wherein said capacitance varying means comprises electrode displacing means for displacing said sense electrode between a first and a second position different in distance from the object.

28. A device as claimed in claim 27, wherein said voice coil varies a distance between the object and said sense electrode greatly, or displaces said sense coil between said first and second positions greatly, or varies the distance greatly and displaces said sense coil greatly at the same time.

29. A device as claimed in claim 20, wherein said capacitance varying means comprises electrode displacing means for displacing said sense electrode over different widths.

30. A device as claimed in claim 29, wherein said voice coil varies a distance between the object and said sense electrode greatly, or displaces said sense coil between said first and second positions greatly, or varies the distance greatly and displaces said sense coil greatly at the same time.

31. A device for sensing a surface potential of an object, comprising:

a single sense electrode spaced a preselected distance from the object and electrically independent of the object;

capacitance varying means for varying an electrostatic capacitance between the object and the single sense electrode by vibrating the single sense electrode thereby to induce on said single sense electrode, in association with the surface potential of the object, a potential having at least two different frequency components;

potential detecting means for detecting said potential of the single sense electrode induced in association with the surface potential of the object and varying along with the electrostatic capacitance;

output detecting means for detecting first and second potential values based on the at least two frequency components in the potential detected by said potential detecting means; and surface potential outputting means for determining the surface potential of said object based on a ratio of the detected first and second potential values and outputting the surface potential of the object;

said capacitance varying means comprising a voice coil.

* * * * *